(12) United States Patent
Shim et al.

(10) Patent No.: US 8,923,060 B2
(45) Date of Patent: Dec. 30, 2014

(54) NONVOLATILE MEMORY DEVICES AND OPERATING METHODS THEREOF

(71) Applicant: Samsung Electronics Co., Ltd., Suwon-Si (KR)

(72) Inventors: Sunil Shim, Seoul (KR); Jaehoon Jang, Seongnam-si (KR); Donghyuk Chae, Seoul (KR); Youngho Lim, Yongin-si (KR); Hansoo Kim, Suwon-si (KR); Jaehun Jeong, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/721,963

(22) Filed: Dec. 20, 2012

(65) Prior Publication Data

US 2013/0107629 A1 May 2, 2013

Related U.S. Application Data

(63) Continuation-in-part of application No. 12/986,798, filed on Jan. 7, 2011, now Pat. No. 8,427,878.

(60) Provisional application No. 61/359,410, filed on Jun. 29, 2010.

(30) Foreign Application Priority Data

Feb. 17, 2010 (KR) .................. 10-2010-0014275

(51) Int. Cl.
*G11C 16/04* (2006.01)
*G11C 16/06* (2006.01)
*G11C 16/10* (2006.01)
*H01L 27/115* (2006.01)
*G11C 16/34* (2006.01)
*G11C 16/30* (2006.01)

(52) U.S. Cl.
CPC .............. *G11C 16/30* (2013.01); *G11C 16/10* (2013.01); *H01L 27/11582* (2013.01); *G11C 16/3459* (2013.01); *G11C 16/0483* (2013.01); *G11C 16/3418* (2013.01); *H01L 27/1157* (2013.01)
USPC ............ 365/185.18; 365/185.17; 365/185.22; 365/185.23; 365/185.28

(58) Field of Classification Search
USPC .................................................. 365/185.18
See application file for complete search history.

(56) References Cited

U.S. PATENT DOCUMENTS 5,511,022 A 4/1996 Yim et al.
5,673,223 A 9/1997 Park
(Continued)

FOREIGN PATENT DOCUMENTS

CN 1906700 A 1/2007
CN 101106140 A 1/2008
(Continued)

OTHER PUBLICATIONS

US Office Action dated Jan. 15, 2013 for related U.S. Appl. No. 13/028,918.
(Continued)

*Primary Examiner* — Son Mai
(74) *Attorney, Agent, or Firm* — Harness, Dickey & Pierce, P.L.C.

(57) ABSTRACT

According to example embodiments of inventive concepts, a nonvolatile memory device includes a memory cell array including a plurality of memory cells; a word line driver configured to at least one of select and unselect a plurality of word lines connected with the plurality of memory cells, respectively, and to supply voltages to the plurality of word lines; and a read/write circuit configured to apply bias voltages to a plurality of bit lines connected with the plurality of memory cells. The read/write circuit may be configured to adjust levels of the bias voltages applied to the plurality of bit lines according to location of a selected word line among the plurality of word lines.

20 Claims, 37 Drawing Sheets

(56) References Cited

U.S. PATENT DOCUMENTS

| | | |
|---|---|---|
| 5,715,193 A | 2/1998 | Norman |
| 5,740,107 A | 4/1998 | Lee |
| 5,923,587 A | 7/1999 | Choi |
| 6,009,014 A | 12/1999 | Hollmer et al. |
| 6,028,788 A | 2/2000 | Choi et al. |
| 6,285,587 B1 | 9/2001 | Kwon |
| 6,295,227 B1 | 9/2001 | Sakui et al. |
| 6,650,566 B2 | 11/2003 | Jeong et al. |
| 6,850,439 B1 | 2/2005 | Tanaka |
| 6,894,924 B2 | 5/2005 | Choi et al. |
| 6,975,542 B2 | 12/2005 | Roohparvar |
| 7,064,981 B2 | 6/2006 | Roohparvar |
| 7,064,986 B2 | 6/2006 | Lee et al. |
| 7,079,419 B2 | 7/2006 | Roohparvar |
| 7,149,124 B2 | 12/2006 | Nazarian |
| 7,177,192 B2 | 2/2007 | Yoon et al. |
| 7,233,522 B2 | 6/2007 | Chen et al. |
| 7,292,476 B2 | 11/2007 | Goda et al. |
| 7,403,422 B2 | 7/2008 | Kim et al. |
| 7,403,429 B2 | 7/2008 | Chae et al. |
| 7,408,806 B2 | 8/2008 | Park et al. |
| 7,417,904 B2 | 8/2008 | Sivero et al. |
| 7,450,433 B2 | 11/2008 | Wan et al. |
| 7,480,178 B2 | 1/2009 | Park et al. |
| 7,489,556 B2 | 2/2009 | Tanzawa |
| 7,518,920 B2 | 4/2009 | Kang |
| 7,529,138 B2 | 5/2009 | Park et al. |
| 7,532,514 B2 | 5/2009 | Cernea et al. |
| 7,551,477 B2 * | 6/2009 | Mokhlesi et al. ........ 365/185.11 |
| 7,551,487 B2 | 6/2009 | Park et al. |
| 7,551,492 B2 | 6/2009 | Kim |
| 7,566,927 B2 | 7/2009 | Kim et al. |
| 7,606,074 B2 | 10/2009 | Wan et al. |
| 7,633,803 B2 | 12/2009 | Lee |
| 7,652,931 B2 | 1/2010 | Park et al. |
| 7,668,014 B2 | 2/2010 | Hwang |
| 7,724,577 B2 | 5/2010 | Goda et al. |
| 7,778,078 B2 | 8/2010 | Nagadomi et al. |
| 7,778,084 B2 | 8/2010 | Kim et al. |
| 7,813,184 B2 | 10/2010 | Kim et al. |
| 7,859,902 B2 | 12/2010 | Maejima |
| 7,888,731 B2 | 2/2011 | Kim |
| 7,924,629 B2 | 4/2011 | Park et al. |
| 7,933,151 B2 | 4/2011 | Maeda et al. |
| 7,936,004 B2 | 5/2011 | Kito et al. |
| 7,936,617 B2 | 5/2011 | Sudo |
| 7,940,572 B2 | 5/2011 | Kim |
| 7,952,136 B2 | 5/2011 | Kito et al. |
| 7,983,084 B2 | 7/2011 | Tokiwa et al. |
| 8,013,389 B2 | 9/2011 | Oh et al. |
| 8,023,321 B2 | 9/2011 | Kim |
| 8,125,825 B2 | 2/2012 | Seol |
| 8,149,635 B2 | 4/2012 | Lee |
| 8,169,826 B2 | 5/2012 | Hishida et al. |
| 8,189,391 B2 | 5/2012 | Itagaki et al. |
| 8,228,733 B2 | 7/2012 | Tokiwa et al. |
| 8,243,518 B2 | 8/2012 | Oh et al. |
| 8,274,108 B2 | 9/2012 | Katsumata et al. |
| 8,318,602 B2 | 11/2012 | Kito et al. |
| 8,467,246 B2 | 6/2013 | Kim et al. |
| 8,570,805 B2 | 10/2013 | Lee |
| 8,582,372 B2 | 11/2013 | Kim |
| 8,638,608 B2 * | 1/2014 | Lai et al. ................. 365/185.17 |
| 2002/0007131 A1 | 1/2002 | Zemont |
| 2002/0071311 A1 | 6/2002 | Jeong et al. |
| 2005/0000669 A1 | 1/2005 | West |
| 2005/0006692 A1 | 1/2005 | Kim et al. |
| 2005/0128807 A1 | 6/2005 | Chen et al. |
| 2005/0141283 A1 | 6/2005 | Lee et al. |
| 2005/0248991 A1 | 11/2005 | Lee et al. |
| 2006/0050594 A1 | 3/2006 | Park |
| 2006/0140012 A1 | 6/2006 | Wan et al. |
| 2007/0018320 A1 | 1/2007 | Tanida et al. |
| 2007/0025220 A1 | 2/2007 | Yoshikawa et al. |
| 2007/0029723 A1 | 2/2007 | Sato |
| 2007/0070701 A1 | 3/2007 | Kim et al. |
| 2007/0158736 A1 | 7/2007 | Arai et al. |
| 2007/0159886 A1 | 7/2007 | Kang |
| 2007/0183204 A1 | 8/2007 | Kim et al. |
| 2007/0230253 A1 | 10/2007 | Kim |
| 2007/0247912 A1 | 10/2007 | Kamigaichi et al. |
| 2007/0252201 A1 | 11/2007 | Kito et al. |
| 2007/0297234 A1 | 12/2007 | Cernea et al. |
| 2008/0007999 A1 | 1/2008 | Park et al. |
| 2008/0013377 A1 | 1/2008 | Sel et al. |
| 2008/0027901 A1 | 1/2008 | Sanborn |
| 2008/0099819 A1 | 5/2008 | Kito et al. |
| 2008/0173928 A1 | 7/2008 | Arai et al. |
| 2008/0173933 A1 | 7/2008 | Fukuzumi et al. |
| 2008/0181020 A1 | 7/2008 | Yu et al. |
| 2008/0253183 A1 | 10/2008 | Mizukami et al. |
| 2008/0279012 A1 | 11/2008 | Lee |
| 2008/0310230 A1 | 12/2008 | Kim et al. |
| 2009/0002182 A1 | 1/2009 | Knox et al. |
| 2009/0002198 A1 | 1/2009 | Bach |
| 2009/0003075 A1 | 1/2009 | Kim et al. |
| 2009/0021983 A1 | 1/2009 | Wan et al. |
| 2009/0021988 A1 | 1/2009 | Hong et al. |
| 2009/0027935 A1 | 1/2009 | Nakata et al. |
| 2009/0097309 A1 | 4/2009 | Mizukami et al. |
| 2009/0122613 A1 | 5/2009 | Kim et al. |
| 2009/0168533 A1 | 7/2009 | Park et al. |
| 2009/0172267 A1 | 7/2009 | Oribe et al. |
| 2009/0175081 A1 | 7/2009 | Kim |
| 2009/0180323 A1 | 7/2009 | Park et al. |
| 2009/0268523 A1 | 10/2009 | Maejima |
| 2009/0268524 A1 | 10/2009 | Maejima |
| 2009/0279359 A1 | 11/2009 | Goda et al. |
| 2009/0316491 A1 | 12/2009 | Park et al. |
| 2010/0038703 A1 | 2/2010 | Fukuzumi et al. |
| 2010/0107021 A1 | 4/2010 | Nagadomi et al. |
| 2010/0124120 A1 | 5/2010 | Park et al. |
| 2010/0159657 A1 | 6/2010 | Arai et al. |
| 2010/0177566 A1 | 7/2010 | Kim et al. |
| 2010/0195395 A1 | 8/2010 | Jeong et al. |
| 2010/0238732 A1 | 9/2010 | Hishida et al. |
| 2011/0063913 A1 | 3/2011 | Maejima |
| 2011/0170352 A1 | 7/2011 | Kim |
| 2011/0189853 A1 | 8/2011 | Kito et al. |
| 2011/0199825 A1 | 8/2011 | Han et al. |
| 2011/0216603 A1 | 9/2011 | Han et al. |
| 2011/0238913 A1 | 9/2011 | Kurashige et al. |
| 2012/0045890 A1 | 2/2012 | Sel et al. |
| 2012/0060066 A1 | 3/2012 | Nagadomi et al. |
| 2012/0099377 A1 | 4/2012 | Maejima |
| 2012/0275234 A1 | 11/2012 | Lee et al. |
| 2013/0182502 A1 | 7/2013 | Cheo et al. |
| 2014/0022846 A1 | 1/2014 | Kim |

FOREIGN PATENT DOCUMENTS

| | | |
|---|---|---|
| CN | 101165909 A | 4/2008 |
| CN | 101627444 A | 1/2010 |
| JP | 08-279295 | 10/1996 |
| JP | 273826 B2 | 1/1997 |
| JP | 10-032269 A | 2/1998 |
| JP | H10-093083 | 4/1998 |
| JP | 2000-222895 A | 8/2000 |
| JP | 2002203393 A | 7/2002 |
| JP | 2005032430 A | 2/2005 |
| JP | 2005-116119 A | 4/2005 |
| JP | 2005196931 A | 7/2005 |
| JP | 2006-073168 A | 3/2006 |
| JP | 2007087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007272952 A | 10/2007 |
| JP | 2007-293986 A | 11/2007 |
| JP | 2007-323716 A | 12/2007 |
| JP | 2008-103429 A | 5/2008 |
| JP | 2008-172164 A | 7/2008 |
| JP | 2008-310949 A | 12/2008 |

(56) References Cited

FOREIGN PATENT DOCUMENTS

| | | |
|---|---|---|
| JP | 2008-311650 A | 12/2008 |
| JP | 2009-026369 A | 2/2009 |
| JP | 2009-088446 A | 4/2009 |
| JP | 2009124107 A | 6/2009 |
| JP | 2009-266281 A | 11/2009 |
| JP | 2009-266946 A | 11/2009 |
| JP | 2011-508937 A | 3/2011 |
| KR | 100157342 B1 | 7/1998 |
| KR | 10-0390145 B1 | 7/2003 |
| KR | 100541819 B1 | 1/2006 |
| KR | 10-2006-0129806 A | 12/2006 |
| KR | 10-0672151 B1 | 1/2007 |
| KR | 10-2007-0023180 | 2/2007 |
| KR | 10-2007-0034305 | 3/2007 |
| KR | 100688494 B1 | 3/2007 |
| KR | 100706797 B1 | 4/2007 |
| KR | 100729359 B1 | 6/2007 |
| KR | 2007-0078355 A | 7/2007 |
| KR | 100749736 B1 | 8/2007 |
| KR | 10-0884861 B1 | 10/2007 |
| KR | 20070110267 A | 11/2007 |
| KR | 10-0784862 B1 | 12/2007 |
| KR | 10-2008-0005765 A | 1/2008 |
| KR | 2008-0099693 A | 11/2008 |
| KR | 2008-0110168 A | 12/2008 |
| KR | 2009-0002471 A | 1/2009 |
| KR | 10-0884861 A | 2/2009 |
| KR | 100890016 B1 | 3/2009 |
| KR | 10-2009-0034776 A | 4/2009 |
| KR | 100897415 B1 | 5/2009 |
| KR | 1020090048877 A | 5/2009 |
| KR | 10-2009-0072406 A | 7/2009 |
| KR | 1020090079037 A | 7/2009 |
| KR | 20110095104 A | 8/2011 |
| WO | WO-2009/086618 A1 | 7/2009 |

OTHER PUBLICATIONS

US Office Action dated Jan. 15, 2013 for related U.S. Appl. No. 13/023,934.
Jang, J. et al. "Vertical Cell Array using TCAT(Terabit Cell Array Transistor) Technology for Ultra High Density NAND Flash Memory". Symposium on VLSI Technology Digest of Technical Papers p. 192-193; 2009.
US Office Action dated Jul. 23, 2013 for related U.S. Appl. No. 13/211,743.
US Office Action dated Jul. 31, 2013 for related U.S. Appl. No. 13/545,588.
US Office Action dated Apr. 5, 2013 for related U.S. Appl. No. 13/029,518.
US Office Action dated Mar. 12, 2013 for related U.S. Appl. No. 12/985,695.
US Office Action dated Dec. 24, 2013 for related U.S. Appl. No. 13/867,716.
US Office Action dated Jan. 2, 2014 for related U.S. Appl. No. 12/985,695.
Notice of Allowance dated Oct. 11, 2013 in corresponding U.S. Appl. No. 13/967,455.
Office Action dated Nov. 5, 2013 in corresponding U.S. Appl. No. 14/043,256.
Office Action dated Aug. 30, 2013 in corresponding U.S. Appl. No. 12/985,695.
Office Action dated Nov. 1, 2013 in corresponding U.S. Appl. No. 13/545,588.
Office Action dated Mar. 21, 2014 in copending U.S. Appl. No. 13/607,038.
Japanese Office Action for corresponding Japanese application No. 2011-012074 received Apr. 1, 2014.
Japanese Examination report for corresponding Japanese application No. 2011-012072 dated Apr. 8, 2014.
Office Action dated Jun. 12, 2014 for corresponding U.S. Appl. No. 14/043,256.
Notice of Allowance dated Feb. 7, 2014 for related U.S. Appl. No. 13/967,455.
US Office Action dated Feb. 14, 2014 for related U.S. Appl. No. 14/029,100.
Notice of Allowance for corresponding U.S. Appl. No. 13/607,038 dated Aug. 1, 2014.
Notice of Allowance for corresponding U.S. Appl. No. 14/029,100 dated Aug. 6, 2014.
T. Maeda at al. "Multi-stacked 1G cell/layer Pipe-shaped BiCS Flash Memory"; 2009 Symposium on VLSI Circuits, p. 22-23; Jun. 2009.

* cited by examiner

Fig. 8

| WL | Selected WL | | Unselected WL |
|---|---|---|---|
| | Initial Program Voltage | Increment | Pass Voltage |
| WL7 | Vini7 | Vi7 | Vpass7 |
| WL6 | Vini6 | Vi6 | Vpass6 |
| WL5 | Vini5 | Vi5 | Vpass5 |
| WL4 | Vini4 | Vi4 | Vpass4 |
| WL3 | Vini3 | Vi3 | Vpass3 |
| WL2 | Vini2 | Vi2 | Vpass2 |
| WL1 | Vini1 | Vi1 | Vpass1 |

| WL | Unselected WL |
|---|---|
| WL7 | Vread7 |
| WL6 | Vread6 |
| WL5 | Vread5 |
| WL4 | Vread4 |
| WL3 | Vread3 |
| WL2 | Vread2 |
| WL1 | Vread1 |

| WL7 | Vew7 |
| WL6 | Vew6 |
| WL5 | Vew5 |
| WL4 | Vew4 |
| WL3 | Vew3 |
| WL2 | Vew2 |
| WL1 | Vew1 |

| Selected WL | Adjusted Bias Voltages |
|---|---|
| WL7 | VBS7 |
| WL6 | VBS6 |
| WL5 | VBS5 |
| WL4 | VBS4 |
| WL3 | VBS3 |
| WL2 | VBS2 |
| WL1 | VBS1 |

| Selected WL | Adjusted Bias Voltages |
|---|---|
| WL7 | VBS10 |
| WL6 | |
| WL5 | VBS9 |
| WL4 | |
| WL3 | |
| WL2 | VBS8 |
| WL1 | |

NONVOLATILE MEMORY DEVICES AND OPERATING METHODS THEREOF

CROSS-REFERENCE TO RELATED APPLICATIONS

This U.S. non-provisional patent application is a continuation-in-part of U.S. patent application Ser. No. 12/986,798 filed on Jan. 7, 2011, which claims priorities under 35 U.S.C. §119 to Korean Patent Application No. 10-2010-0014275, filed on Feb. 17, 2010, and U.S. Provisional Application No. 61/359,410 filed on Jun. 29, 2010. The entire contents of each of the above-mentioned applications are hereby incorporated by reference.

BACKGROUND

1. Field

Example embodiments of the inventive concepts relate to semiconductor memory devices, and more particularly, to nonvolatile memory devices and operating methods thereof.

2. Description of the Related Art

Semiconductor memory devices are memory devices that are realized using semiconductor materials such as silicon (Si), germanium (Ge), gallium arsenide (GaAs) and indium phosphide (InP).

Semiconductor memory devices are generally classified into volatile and nonvolatile memory devices. Volatile memory devices are memory devices in which stored data is erased when the power source is shut off. Examples of volatile memory devices include Static Random Access Memory (SRAM), Dynamic Random Access Memory (DRAM), and Synchronous Dynamic Random Access Memory (SDRAM). In contrast, nonvolatile memory devices are memory devices that retain stored data even when the power source is shut off. Examples of the nonvolatile memory devices include Read Only Memory (ROM), Programmable Read Only Memory (PROM), Erasable Programmable Read Only Memory (EPROM), Electrically Erasable Programmable Read Only Memory (EEPROM), flash memory device, phase-change random access memory (PRAM), Magnetoresistive Random Access Memory (MRAM), Resistive Random Access Memory (RRAM) and Ferroelectric Random Access Memory (FRAM). Flash memory devices are largely categorized into NOR and NAND types.

SUMMARY

Example embodiments of the inventive concepts may provide nonvolatile memory devices with improved reliability, operating methods thereof, and memory systems including the same.

Example embodiments of the inventive concepts provide a nonvolatile memory device containing: a memory cell array including a plurality of memory cells; a word line driver configured to at least one of select and unselect a plurality of word lines connected with the plurality of memory cells respectively and to supply voltages to the plurality of word lines; and a read/write circuit configured to adjust levels of the bias voltages applied to the plurality of bit lines according to location of selected word line among the plurality of word lines.

The plurality of word lines and the plurality of memory cells may be stacked on a substrate in a direction perpendicular to the substrate, and the read/write circuit may be configured to adjust the levels of the bias voltages according to a distance between the selected word line and the substrate.

The read/write circuit may be configured to sequentially decrease the levels of the bias voltages applied to the plurality of bit lines during a program operation according to an increase in a distance between the selected word line and the substrate.

The read/write circuit may be configured to sequentially decrease, increase, and decrease the levels of the bias voltages applied to the plurality of bit lines during a program operation according to an increase in a distance between the selected word line and the substrate.

The read/write circuit may be configured to sequentially increase and decrease the levels of the bias voltages applied to the plurality of bit lines during a program operation according to an increase in a distance between the selected word line and the substrate.

The read/write circuit may be configured to sequentially increase the levels of the bias voltages applied to the plurality of bit lines during a program verification operation according to an increase in a distance between the selected word line and the substrate.

The read/write circuit may be configured to sequentially increase, decrease, and increase the levels of the bias voltages applied to the plurality of bit lines during a program verification operation according to an increase in a distance between the selected word line and the substrate.

The read/write circuit may be configured to sequentially decrease and increase the levels of the bias voltages applied to the plurality of bit lines during a program verification operation according to an increase in a distance between the selected word line and the substrate.

The read/write circuit may be configured to adjust the applying times of the bias voltages increase according to an increase of the levels of the bias voltages.

According to example embodiments of the inventive concepts, an operating method of a nonvolatile memory device includes adjusting levels of bias voltages according to a location of selected word line among a plurality of word lines, applying the adjusted bias voltages to bit lines, and applying voltages to the selected word line and unselected word lines.

The nonvolatile memory device may include a plurality of memory cells on a substrate, and the plurality of memory cells may be connected with the plurality of word lines. The adjusting levels of bias voltages may include adjusting the levels of the bias voltages according to a distance between the selected word line and the substrate.

The applying voltages to the selected word line and unselected word lines may include applying a pass voltage to the selected and unselected word lines; and applying a program voltage to the selected word line.

The adjusting levels of the bias voltages may include sequentially decreasing the levels of the bias voltages according to an increase in a distance between the selected word line and the substrate.

The nonvolatile memory device may include a plurality of memory cells on a substrate. The plurality of memory cells may be connected with the plurality of word lines. The adjusting levels of bias voltages may include sequentially increasing the levels of the bias voltages according to an increase in a distance between the selected word line and the substrate.

The applying voltages to the selected word line and unselected word lines may include applying a read voltage to the unselected word lines, and applying a verification voltage to the selected word line.

According to example embodiments of the inventive concepts, a nonvolatile memory device including a plurality of nand strings on a substrate, each nand string including a plurality of memory cells; a plurality of bit lines extending in a first direction, each bit line connected to at least two nand strings; a plurality of word lines extending in a second direction, each word line being connected to one of the plurality of memory cells in at least two nand strings; and a control circuit configured to select and unselect the plurality of word lines, respectively, and to adjust levels of bias voltages applied to the plurality of bit lines according to a location of a selected word line among the plurality of word lines.

The plurality of memory cells of each nand string may be stacked in a vertical direction on the substrate. The control circuit may be configured to at least one of sequentially decrease the levels of the bias voltages applied to the plurality of bit lines during a program operation according to an increase in a distance between the selected word line and the substrate, and sequentially increase the levels of the bias voltages applied to the plurality of bit lines during a program verification operation according to an increase in the distance between the selected word line and the substrate.

Each nand string may include: a pillar structure extending vertically from the substrate and including 1 to N parts, and 1 to N memory cells, where the J to N of the 1 to N memory cells are on the 1 to J of the 1 to N memory cells, the 1 to N memory cells defined by an insulating pattern connected to the 1 to N parts of the pillar structure and 1 to N of the plurality of wordlines respectively, the 1 to N memory cells defined by an insulating pattern between the 1 to N parts of the pillar structure and 1 to N gate electrodes respectively, N being an integer greater than 5, J being an integer between 1 to N. The control circuit may be configured to sequentially decrease the levels of the bias voltages applied to the plurality of bit lines during a program operation according to an increase in a distance between the selected word line and the substrate, when the selected word line is connected to one of the 1 to J memory cells of at least one nand string. The control circuit may be configured to sequentially decrease the levels of the bias voltages applied to the plurality of bit lines during a program operation according to an increase in a distance between the selected word line and the substrate, when the selected word line is connected to one of the J+1 to N memory cells of at least one nand string.

Each nand string may include: a pillar structure extending vertically from the substrate and including 1 to N parts, and 1 to N memory cells, where the J to N of the 1 to N memory cells are on the 1 to J of the 1 to N memory cells, the 1 to N memory cells defined by an insulating pattern connected to the 1 to N parts of the pillar structure and 1 to N of the plurality of wordlines respectively, the 1 to N memory cells defined by an insulating pattern between the 1 to N parts of the pillar structure and 1 to N gate electrodes respectively, N being an integer greater than 5, J being an integer between 1 to N. The control circuit may be configured to sequentially increase the levels of the bias voltages applied to the plurality of bit lines during a program verification operation according to an increase in a distance between the selected word line and the substrate, when the selected word line is connected to one of the 1 to J memory cells of at least one nand string. The control circuit may be configured to sequentially increase the levels of the bias voltages applied to the plurality of bit lines during a program verification operation according to an increase in a distance between the selected word line and the substrate, when the selected word line is connected to one of the J+1 to N memory cells of at least one nand string.

The nonvolatile memory device of claim 16, wherein each nand string includes, a pillar structure extending vertically from the substrate and including 1 to N parts, and 1 to N memory cells, where the J to N of the 1 to N memory cells are horizontally spaced apart from the 1 to J of the 1 to N memory cells, the 1 to N memory cells defined by an insulating pattern connected to the 1 to N parts of the pillar structure and 1 to N of the plurality of wordlines respectively, N being an integer greater than 5, J being an integer between 1 to N.

BRIEF DESCRIPTION OF THE DRAWINGS

Example embodiments of the inventive concepts will be more clearly understood from the following brief description taken in conjunction with the accompanying drawings. FIGS. 1-32 represent non-limiting, example embodiments as described herein.

FIG. 1 is a block diagram illustrating nonvolatile memory devices according to example embodiments of the inventive concepts;

FIG. 2 is a block diagram illustrating a memory cell array of FIG. 1;

FIG. 3 is a circuit diagram illustrating one of the memory blocks of FIG. 2;

FIG. 4 is a perspective view illustrating a structure corresponding to the memory block of FIG. 3 according to example embodiments of the inventive concepts;

FIG. 5 is a cross-sectional view taken along the line V-V' of the memory block of FIG. 4;

FIG. 6 is a cross-sectional diagram illustrating the structure of a transistor of FIG. 5;

FIG. 7 is a flowchart illustrating methods of operating a driver of FIG. 1;

FIG. 8 is a table illustrating program operation voltage conditions according to the operation methods of FIG. 7;

FIG. 9 includes 3 graphs illustrating example voltage levels of the voltages of FIG. 8;

FIG. 10 is a table illustrating read operation voltage conditions according to the operation methods of FIG. 7;

FIG. 11 is a graph illustrating example voltage levels of the voltages of FIG. 10;

FIG. 12 is a table illustrating erase operation voltage conditions according to the operation methods of FIG. 7;

FIG. 13 is a graph illustrating example voltage levels of the voltages of FIG. 12;

FIG. 14 is a perspective view illustrating a structure corresponding to the memory block of FIG. 3 according to example embodiments of the inventive concepts;

FIG. 15 is a cross-sectional view taken along the line XV-XV' of the memory block of FIG. 14;

FIG. 16 includes 3 graphs illustrating example word line voltages applied to word lines of a memory block of FIGS. 3, 14, and 15;

FIG. 17 is a diagram illustrating a structure corresponding to the memory block of FIG. 3 according to example embodiments of the inventive concepts;

FIG. 18 is a cross-sectional view taken along the line XVIII-XVIII' of the memory block of FIG. 17;

FIG. 19 is a perspective view illustrating a structure corresponding to the memory block of FIG. 3 according to example embodiments of the inventive concepts;

FIG. 20 is a cross-sectional view taken along the line XX-XX' of the memory block of FIG. 19;

FIG. 21 is a perspective view illustrating a structure corresponding to the memory block of FIG. 3 according to example embodiments of the inventive concepts;

FIG. 22 is a cross-sectional view taken along the line XXII-XXII' of the memory block of FIG. 21;

FIG. 23 is a perspective view illustrating a structure corresponding to the memory block of FIG. 3 according to example embodiments of the inventive concepts;

FIG. 24 is a cross-sectional view taken along the line XXIV-XXIV' of the memory block of FIG. 23;

FIG. 25 is a perspective view illustrating a structure corresponding to the memory block of FIG. 3 according to example embodiments of the inventive concepts;

FIG. 26 is a cross-sectional view taken along the line XXVI-XXVI' of the memory block of FIG. 25;

FIG. 27 includes 3 graphs illustrating example word line voltage levels provided to the memory block of FIGS. 25 and 26;

FIG. 28 is a circuit diagram illustrating one of the memory blocks of FIG. 2 according to example embodiments of the inventive concepts;

FIG. 29 is a circuit diagram illustrating one of the memory blocks of FIG. 2 according to example embodiments of the inventive concepts;

FIG. 30 is a block diagram illustrating memory systems including the nonvolatile memory devices of FIG. 1;

FIG. 31 is a block diagram illustrating an example application of the memory systems of FIG. 30; and FIG. 32 is a block diagram illustrating computing systems including the memory systems described with reference to FIG. 31.

Figure 1:
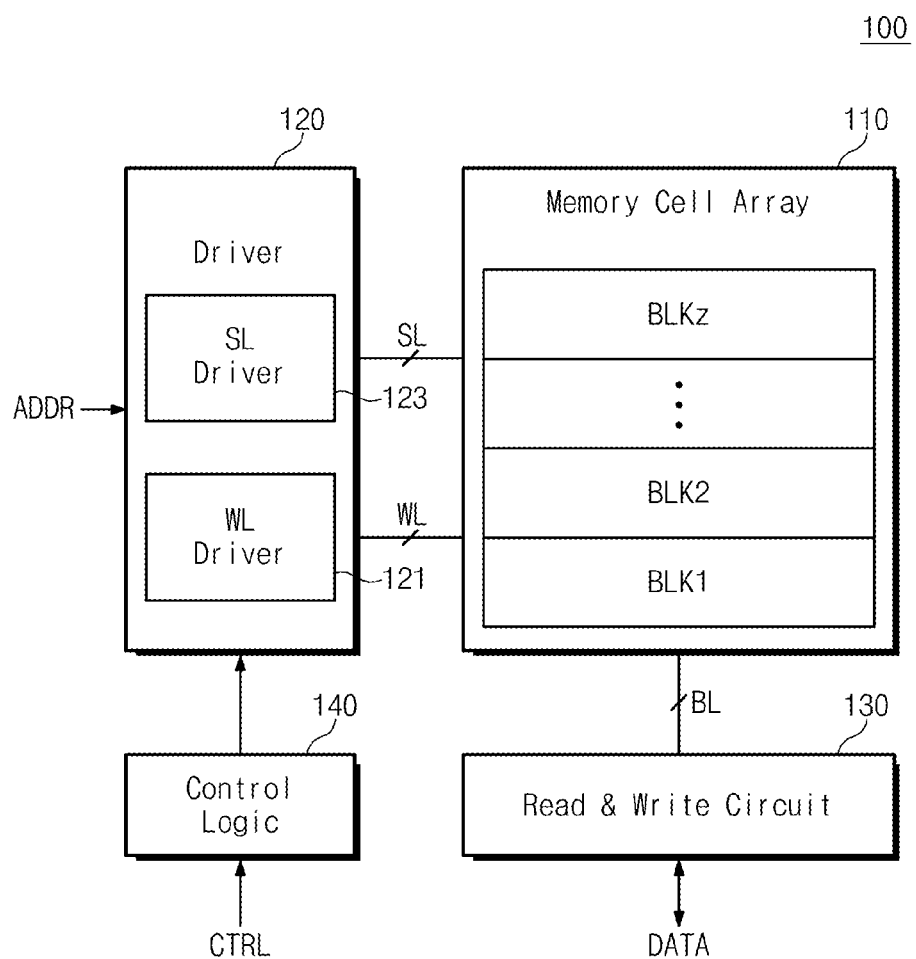

It should be noted that these figures are intended to illustrate the general characteristics of methods, structure and/or materials utilized in certain example embodiments of inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory device 100 according to example embodiments of the inventive concepts. Referring to FIG. 1, the nonvolatile memory device 100 may include a memory cell array 110, a driver 120, a read & write circuit 130, and a control logic 140. The memory cell array 110 may be connected to the driver 120 through word lines WL, and may be connected to the read & write circuit 30 through bit lines BL. The memory cell array 110 may include a plurality of memory cells (not shown). For example, the memory cell array 110 may include a plurality of memory cells stacked along a direction crossing a substrate. The memory cell array 110 may include a plurality of memory cells that can store one or more bits per cell.

The memory cell array 110 may include a plurality of memory blocks BLK1 to BLKz. Each memory block BLK may include a plurality of memory cells. A plurality of word lines WL, a plurality of select lines SL and at least one common source line CSL (not shown) may be provided to each memory block BLK. The driver 120 may be connected to the memory cell array 110 through the word lines WL. The driver 120 may be configured to operate in response to the control of the control logic 140. The driver 120 may receive an address ADDR from the outside.

The driver 120 may be configured to decode a received address ADDR. The driver 120 may select word lines WL using the decoded address. The driver 120 may be configured to apply word line voltages to the word lines WL. For example, the driver 120 may be configured to apply a select voltage and an unselect voltage and/or a word line erase voltage to selected and unselected word lines WL, respectively. For example, the driver 120 may be configured to apply a program operation voltage associated with a program operation, a read operation voltage associated with a read operation, or an erase operation voltage associated with an erase operation to the word lines during a program operation, read operation, or erase operation, respectively. For example, the driver 120 may include a word line driver 121 that selects and drives word lines.

For example, the driver 120 may be configured to select and drive select lines SL. For example, the driver 120 may be configured to further select and drive a string select line SSL (not shown) and a ground select line GSL (not shown). For example, the driver 120 may further include a select line driver 123 configured to select and drive select lines. For example, the driver 120 may be configured to drive a common source line CSL (not shown). For example, the driver 120 may include a common source line driver (not shown) configured to drive a common source line CSL (not shown).

The read & write circuit 130 may be connected to the memory cell array 110 through the bit lines BL. The read & write circuit 130 may operate in response to the control of the control logic 140. The read & write circuit 130 may be configured to select bit lines BL. For example, the read & write circuit 130 may receive data DATA from the outside, and/or write the received data in the memory cell array 110. The read & write circuit 130 may read data DATA from the memory cell array 110 and/or deliver the read data to the outside. The read & write circuit 130 may read data from a first storage region of the memory cell array 110 and/or write the read data in a second storage region of the memory cell array 110. For example, the read & write circuit 130 may be configured to perform a copy-back operation.

For example, the read & write circuit 130 may include well-known components (not shown) such as a page buffer and/or page register, a column select circuit, and/or a data buffer. As another example, the read & write circuit 130 may include well-known components (not shown) such as a sense amplifier, a write driver, a column select circuit, and/or a data buffer. The control logic 140 may be connected to the driver 120 and/or the read & write circuit 130. The control logic 140 may be configured to control overall operations of the nonvolatile memory device 100. The control logic 140 may operate in response to control signals CTRL from the outside.

Figure 2:
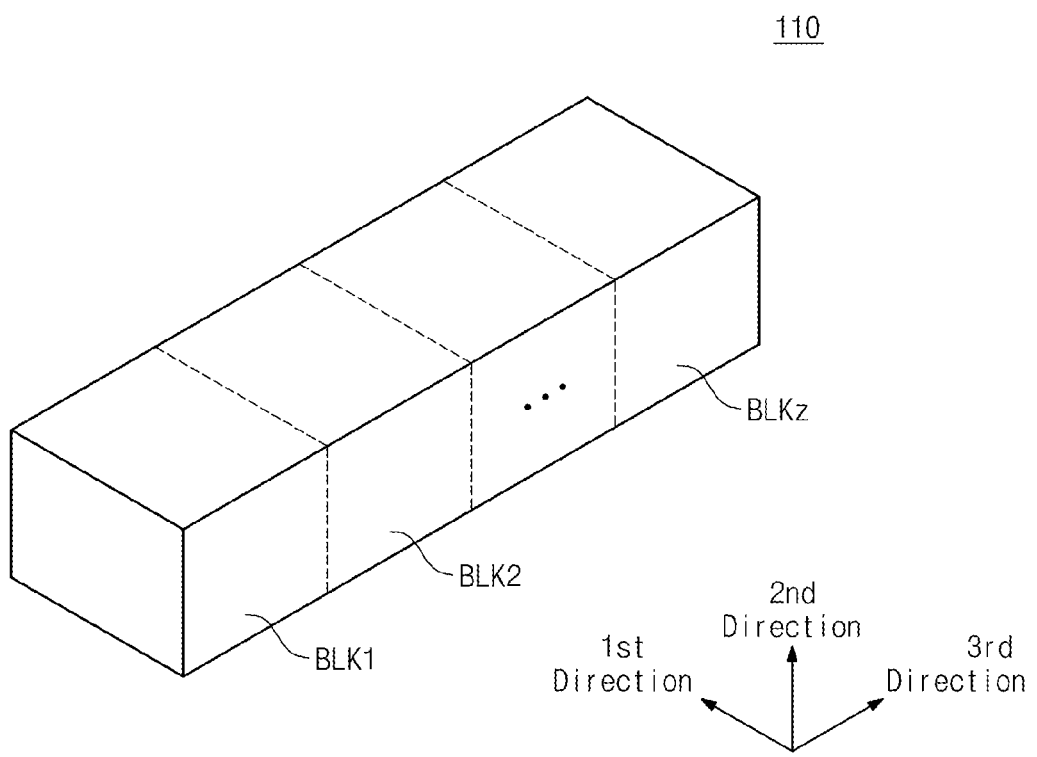
Figure 3:
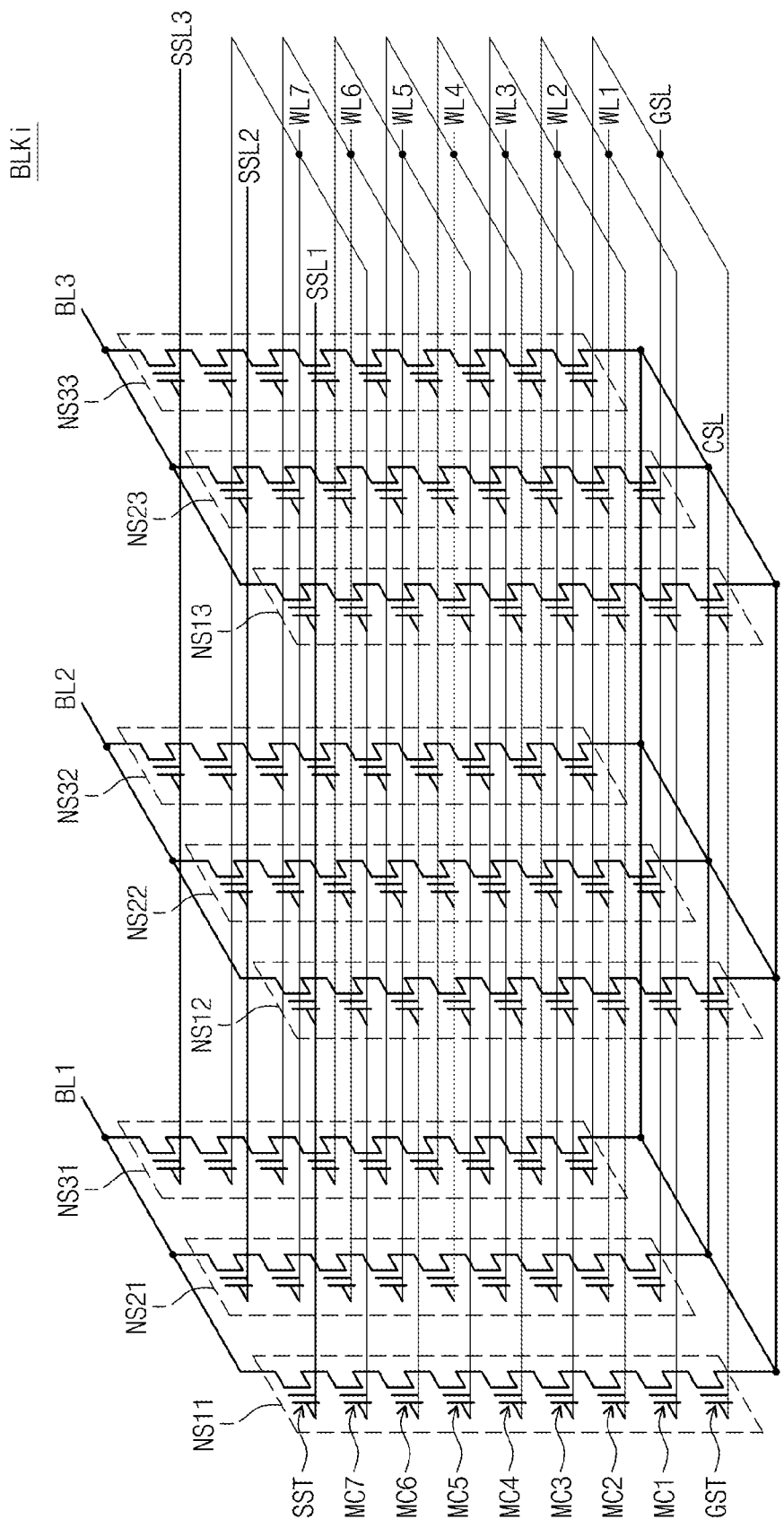

FIG. 2 is a block diagram illustrating the memory cell array 110 of FIG. 1. FIG. 3 is a circuit diagram illustrating one of memory blocks of FIG. 2. Referring to FIGS. 2 and 3, the memory cell array 110 may include a plurality of memory blocks BLK1-BLKz. Each memory block BLK may have a three-dimensional structure (or vertical structure). For example, each memory block BLK may include structures extending in first to third directions. Each memory block BLK may include a plurality of NAND strings NS extending in the second direction. A plurality of NAND strings NS may be provided in the first and third directions.

Each NAND string NS may be connected to bit lines BL, string select lines SSL, a ground select lines GSL, word lines WL, and common source lines CSL. Each memory block may be connected to a plurality of bit lines BL, a plurality of string select lines SSL, a plurality of ground select lines GSL, a plurality of word lines WL, and/or a plurality of common source lines CSL.

Referring to FIG. 3, NAND strings NS11-NS31 may be provided between a first bit line BL1 and a common source line CSL. NAND strings NS12-NS32 may be provided between a second bit line BL2 and the common source line CSL. NAND strings NS13-NS33 may be provided between a third bit line BL3 and the common source line CSL. Each NAND string NS may include a string select transistor SST, a ground select transistor GST, a plurality of memory cells MC connected between the string select transistor SST and/or the ground select transistor GST. The string select transistor SST of each NAND string NS may be connected to a corresponding bit line BL. The ground select transistor GST of each NAND string NS may be connected to the common source line.

Hereinafter, the NAND strings NS may be defined on the basis of rows and columns. NAND strings NS connected in common to one bit line BL may form one column. For example, the NAND strings NS11-NS31 connected to the first bit line BL1 may correspond to a first column. The NAND strings NS12-NS32 connected to the second bit line BL2 may correspond to a second column. The NAND strings NS13-NS33 connected to the third bit line BL3 may correspond to a third column. NAND strings NS connected to one string select line SSL may form one row. For example, the NAND strings NS11-NS13 connected to the first string select line SSL1 may form a first row. The NAND strings NS21-NS23 connected to the second string select line SSL2 may form a second row. The NAND strings NS31-NS33 connected to the third string select line SSL3 may form a third row.

A height may be defined for each NAND string NS. For example, in each NAND string NS, the height of the ground select transistor GST may be defined as 1. The height of a memory cell MC1 adjacent to the ground select transistor SST may be defined as 2. The height of the string select transistor SST may be defined as 9. The height of a memory cell MC7 adjacent to the string select transistor SST may be defined as 8. As the order of a memory cell MC from the ground select transistor GST increases, the height of the memory cell MC increases. For example, the first to seventh memory cells MC1-MC7 may be defined as having heights of 2-8, respectively.

NAND strings NS in a same row may share a string select line SSL. NAND strings NS in different rows may be connected to different string select lines SSL1-SSL3. NAND strings NS11-NS13, NS21-NS22, and NS31-NS33 may share the ground select line GSL. In the NAND strings NS11-NS13, NS21-NS23, and NS31-NS33, memory cells MC of the same height may share the same word line WL. The common source line may be connected in common to the NAND strings NS.

Hereinafter, first string select transistors SST1 may be defined as string select transistors SST connected to the first string select line SSL1. Second string select transistors SST2 may be defined as string select transistors SST connected to the second string select line SSL2. Third string select transistors SST3 may be defined as string select transistors SST connected to the third string select line SSL3. As illustrated in FIG. 3, word lines WL of the same height may be connected in common. Upon selecting a specific word line WL, all NAND strings NS connected to the specific word line WL may be selected.

NAND strings NS in different rows may be connected to different string select lines SSL. Accordingly, by selecting or unselecting string select lines SSL1-SSL3, NAND strings NS of an unselected row among NAND strings NS connected to the same word line WL may be separated from a corresponding bit line, and NAND strings NS of a selected row may be electrically connected to a corresponding to bit line. Similarly, NAND string NS of different rows may be connected to different ground select lines GSL. The row of NAND strings NS may be selected by selecting or unselecting the string select lines SSL1-SSL3. The column of NAND strings NS of a select row may be selected by selecting the bit lines BL1-BL3.

Figure 4:
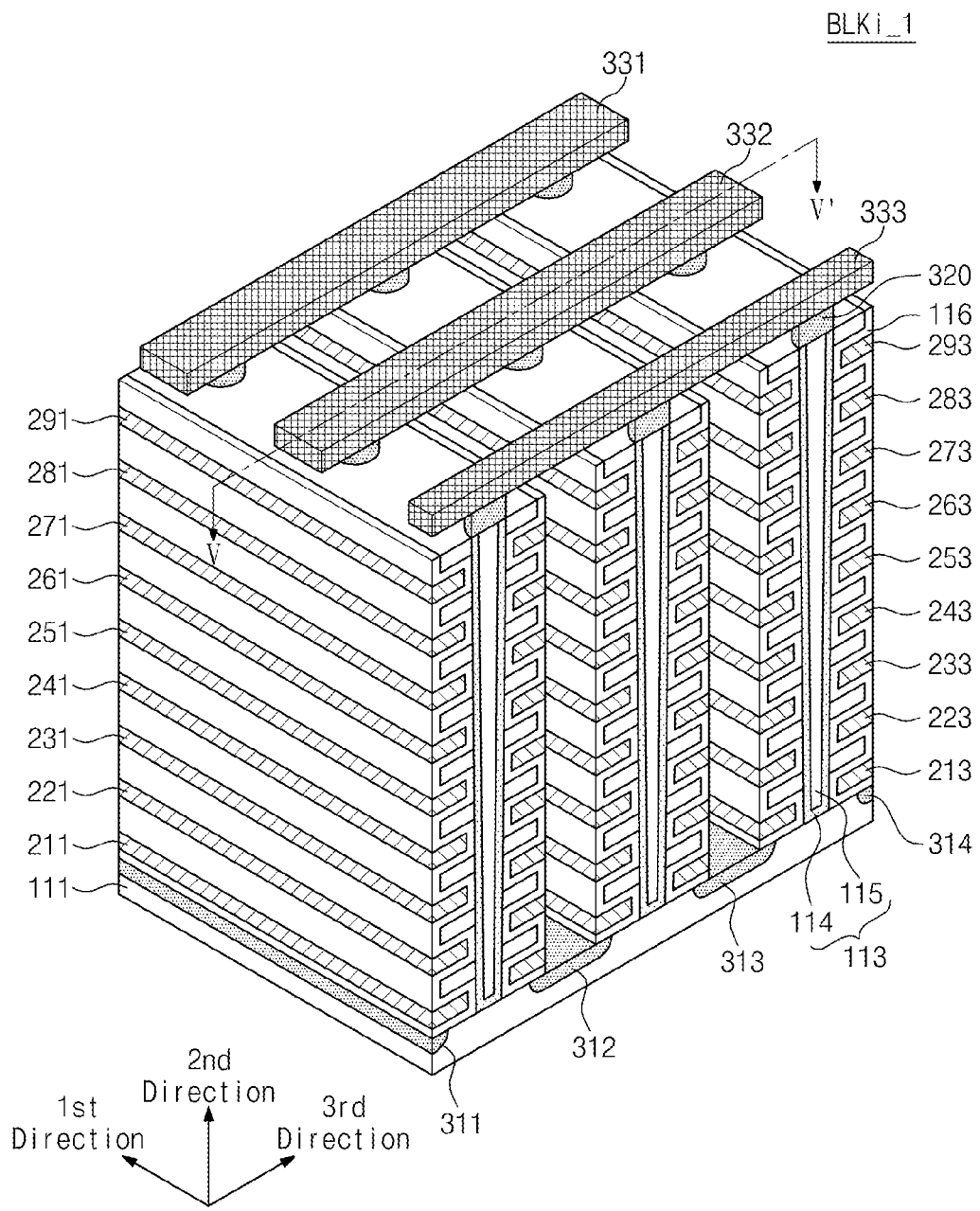
Figure 5:
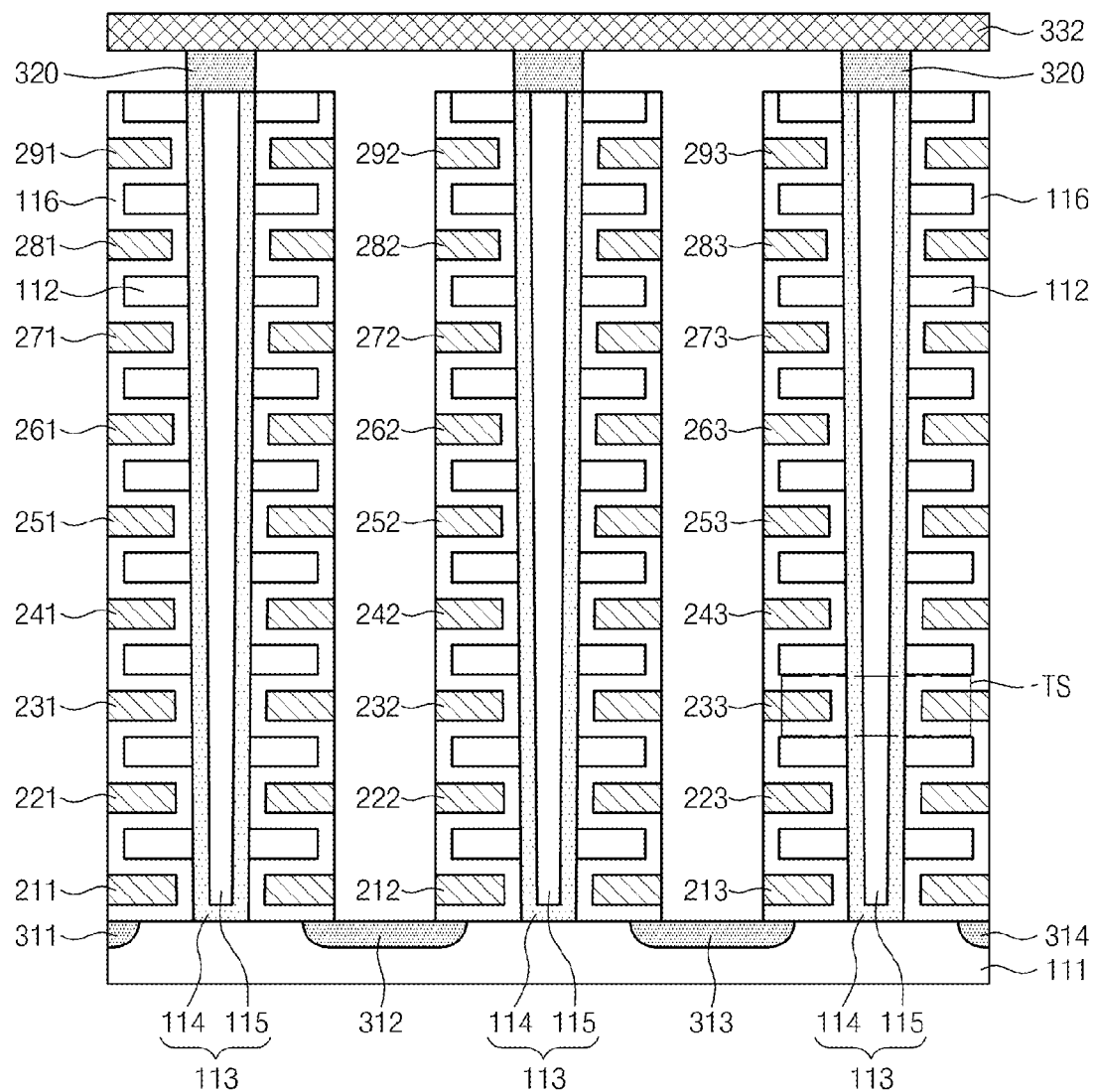

FIG. 4 is a perspective view illustrating a structure of a memory block BLKi_1 corresponding to the memory block BLKi of FIG. 3 according to example embodiments of the inventive concepts. FIG. 5 is a cross-sectional view taken along the line V-V' of the memory block BLKi_1 of FIG. 4. Referring to FIGS. 4 and 5, the memory block BLKi_1 may include structures extending in first to third direction.

A substrate 111 may be provided. For example, the substrate 111 may be a well of a first type (e.g., first conductive type). The substrate 111 may be, for example, a p-well that is formed by implanting a group V element such as boron (B). For example, the substrate 111 may be a pocket p-well in an n-well. Hereinafter, it will be assumed that the substrate 111 is a p-type well (or p-type pocket well), but embodiments are not limited thereto.

A plurality of doping regions 311-314 extending in the first direction may be in the substrate 111. For example, the plurality of doping regions 311-314 may be a second type (e.g., second conductive type) different from the substrate 111. For example, the plurality of doping regions 311-314 may be n-type. Hereinafter, it will be assumed that the first through fourth doping regions 311-314 are n-type, but embodiments are not limited thereto. It is noted that example embodiments are not limited to a particular doping scheme and one having ordinary skill in the art understands that other doping schemes are possible.

A plurality of insulating materials 112 extending in the first direction may be over the substrate 111 between the first and second doping regions 311 and 312 along the second direction. For example, the plurality of insulating materials 112 may be along the second direction at intervals. For example, the insulating materials 112 may include, for example, silicon oxide.

A plurality of pillars 113 may be over the substrate 111 between the first and second doping regions 311 and 312 along the first direction, and penetrate the insulating materials 112 along the second direction. For example, the plurality of pillars 113 may contact the substrate 111 through the insulating materials 112.

Each of pillars 113 may be a plurality of materials. For example, surface layers 114 of the pillars 113 may include a silicon material of the first type. For example, the surface layer 114 of each pillar 113 may include a silicon material with the same type as the substrate 111. Hereinafter, it will be assumed that the surface layer 114 of each pillar 113 includes p-type silicon, but embodiments are not limited thereto.

Internal layers 115 of the pillars 113 may include insulating materials. For example, the internal layers 114 may include silicon oxide. For example, the internal layer 115 of each pillar 113 may include an air gap. An insulation layer 116 may be along the insulation layers 112, the pillars 113, and an exposed surface of the substrate 111, between the first and second doping regions 311 and 312. The insulation layer 116 on the exposed surface of the last insulating material of the second direction may not be present (e.g., removed).

The thickness of the insulation layer 116 may be, for example, smaller than half of a distance between the insulating materials 112. A region that may receive a material except for the insulating materials 112 and the insulation layer 116 may be between the insulation layer 116 on the undersurface of a first insulating material of the insulating materials 112 and the insulation layer 116 provided on the upper surface of a second insulating material under the first insulating material.

First conductive materials 211-291 may be provided on an exposed surface of the insulation layer 116 between the first and second doping regions 311 and 312. For example, the first conductive material 211 may be extended in the first direction between the substrate 111 and the insulating material 112 adjacent to the substrate 111. The first conductive material 211 may be extended in the first direction between the substrate 111 and the insulation layer 116 on the undersurface of the insulating material 112 adjacent to the substrate 111.

A first conductive material may be extended in the first direction between the insulation layer 116 on the upper surface of an insulating material and the insulation layer 116 on the undersurface of an insulating material. For example, a plurality of first conductive materials 221-281 may be extended in the first direction between the insulating materials 112. The first conductive materials 211-291 may include, for example, metallic materials. The conductive materials 211-291 may include, for example, polysilicon.

Structures similar to the structures over the first and second doping regions 311 and 312 may be provided between the second and third doping regions 312 and 313. For example, a plurality of insulating materials 112 extending in the first direction, a plurality of pillars 113 in the first direction penetrating the plurality of insulating materials 112 in the second direction, an insulation layer 116 on exposed surfaces of the plurality of pillars 113 and the plurality of insulating materials 112, and a plurality of first conductive materials 212-292 may be provided between the second and third doping regions 312 and 313.

Structures similar to the structures over the first and second doping regions 311 and 312 may be provided between the third and fourth doping regions 313 and 314. For example, a plurality of insulating materials 112 extending in the first direction, a plurality of pillars 113 in the first direction penetrating the plurality of insulating materials 112 in the third direction, an insulation layer 116 provided on exposed surfaces of the plurality of pillars 113 and the plurality of insulating materials 112, and a plurality of first conductive materials 213-293 may be provided between the second and third doping regions 313 and 314.

Hereinafter, the height of the first conductive materials 211-291, 212-292, and 213-293 may be defined. The first conductive materials 211-291, 212-292, and 213-293 may be defined as having first to ninth heights. The first conductive materials 211-213 adjacent to the substrate 111 may be a first height. The first conductive materials 291-293 adjacent to the second conductive materials 331-333 may be a ninth height. As the order of a specific conductive material of the first conductive materials 211-291, 212-292, and 213-293 increases from the substrate 111, the height of the first conductive material may increase. It is noted that example embodiments are not limited to a vertical orientation and the term 'height' is used only for explanation purposes.

Drains 320 may be over the plurality of pillars 113, respectively. For example, the drains 320 may include silicon materials doped with a second type. The drains 320 may include silicon materials doped with an n-type. Hereinafter, it will be assumed that the drains 320 include n-type silicon materials, but embodiments are not limited thereto. The width of each drain 320 may be, for example, greater than that of a corresponding pillar 113. For example, the respective drains 320 may be a pad type on the upper surface of the pillar 113. Each drain 320 may be extended to a portion of the surface layer 114 of the corresponding pillar 113.

Second conductive materials 331-333 extending in the third direction may be provided on the drains 320. The second conductive materials 331-333 may be at intervals in the first direction (e.g., a same interval). The respective conductive materials 331-333 may be connected to corresponding drains 320. For example, the drains 320 and the second conductive materials 333 extending in the third direction may be connected through contact plugs. The second conductive materials 331-333 may include metallic materials. The second conductive materials 331-333 may include polysilicon.

In FIGS. 4 and 5, each pillar 113 may form a string along with the insulation layer 116 and the plurality of first conductive lines 211-291, 212-292, and 213-293 extending in the first direction. For example, the respective pillar 113 may form a NAND string NS along with adjacent regions of the insulation layer 116 and adjacent regions of the plurality of conductive lines 211-291, 212-292, and 213-293. Each NAND string NS may include a plurality of transistors TS. The structure of the transistor TS will be described in detail with reference to FIG. 6.

Figure 6:
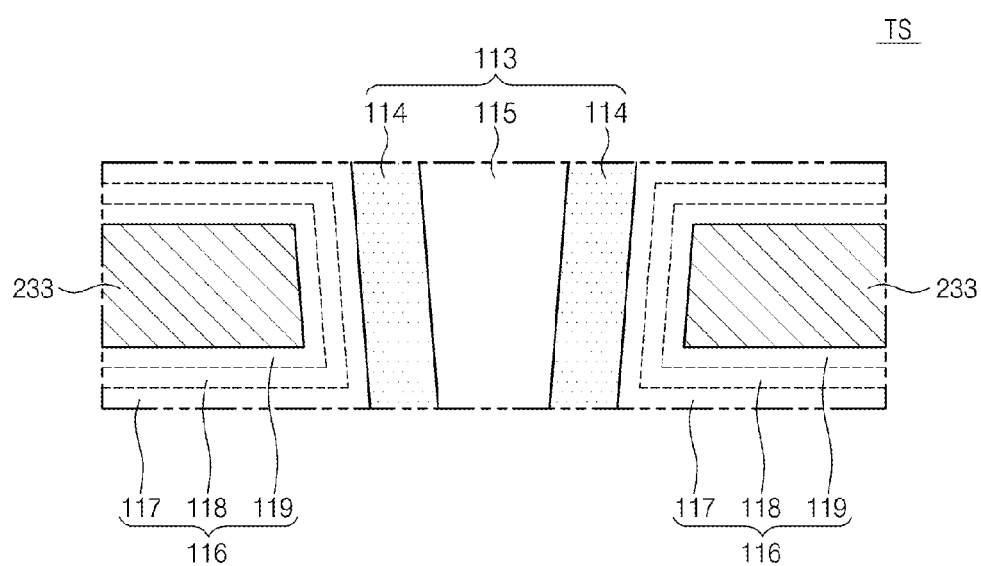

FIG. 6 is a cross-sectional diagram illustrating the structure of the transistor TS of FIG. 5. Referring to FIGS. 4-6, an insulation layer 116 may include at least three sub-insulation layers 117, 118 and 119. The surface layer 114 of the pillar 113, including p-type silicon, may serve as a body. The first sub-insulation layer 117 adjacent to the pillar 113 may serve as a tunneling insulation layer. For example, the first sub-insulation layer 117 adjacent to the pillar 113 may include a thermal oxide layer.

The second sub-insulation layer 118 may serve as a charge storage layer. For example, the second sub-insulation layer 118 may serve as a charge trap layer. For example, the second sub-insulation layer 118 may include a nitride or a metal oxide layer (e.g., aluminum oxide layer and/or hafnium oxide layer). The third sub-insulation layer 119 adjacent to the first conductive materials 233 may serve as a blocking insulation layer. For example, the third subs-insulation layer 119 adjacent to the first conductive material 233 extending in the first direction may be a mono- or multi-layer. The third sub-insulation layer 119 may be a high dielectric layer (e.g., aluminum oxide layer and/or hafnium oxide layer) having a higher dielectric constant than those of the first and second sub-insulation layers 117 and 118.

The conductive material 233 may serve as a gate (or control gate). The silicon oxide layer 119 may serve as a blocking insulation layer. The silicon nitride layer 118 may serve as a charge storage layer. The first conductive material 233 serving as a gate (or control gate), the third sub-insulation layer 119 serving as a blocking insulation layer, the second sub-insulation layer 118 serving as a charge storage layer, the first sub-insulation layer 117 serving as a tunneling insulation layer, and the surface layer 114 serving as a body and including p-type silicon may be a transistor (or memory cell transistor structure). For example, the first to third sub-insulation layers 117-119 may constitute Oxide-Nitride-Oxide (ONO). Hereinafter, the surface layer 114 of the pillar 113 including p-type silicon may be defined as serving as a second-direction body.

In a memory block BLKi_1, one pillar 113 may correspond to one NAND string NS. The memory block BLKi may include a plurality of pillars 113. The memory block BLKi_1 may include a plurality of NAND strings NS. The memory block BLKi_1 may include a plurality of NAND strings NS extending in the second direction (or vertical direction to the substrate 111). The respective NAND strings NS may include a plurality of transistor structures TS disposed along the second direction. At least one of the plurality of transistor structures TS of each NAND string may serve as a string select transistor SST. At least one of the plurality of transistor structures TS of each NAND string NS may serve as a ground select transistor GST.

The gates (or control gates) may correspond to the first conductive materials 211-291, 212-292, and 213-293 extending in the first direction. The gates (or control gates) may extend in the first direction to form word lines WL and two select lines SL (e.g., one or more string select line SSL and one or more ground select line GSL). The second conductive materials 331-333 extending in the third direction may be connected to one end of the NAND strings NS. For example, the second conductive materials 331-333 extending in the third direction may serve as bit lines BL. A plurality of NAND strings NS may be connected to one bit line BL in one memory block BLKi.

Second type doping regions 311-314 extending in the first direction may be provided to an end of the NAND strings NS opposite the end connected to the second conductive materials 331-333. The second type doping region 311-314 extending in the first direction may serve as common source lines CSL.

The memory block BLKi_1 may include a plurality of NAND strings extending in a vertical direction (second direction) to the substrate 111, and may serve as a NAND flash memory block (e.g., charge trapping type) in which a plurality of NAND strings NS are connected to one bit line BL.

Although it has been described in FIGS. 4-6 that the conductive materials 211-291, 212-292, and 213-293 extending in the first direction are nine layers, embodiments are not limited thereto. For example, the first conductive materials extending in the first direction may be eight layers corresponding to eight memory cells and two layers corresponding to two select transistors. The first conductive materials may be at least sixteen layers corresponding to sixteen memory cells and at least two layers corresponding to select transistors. The first conductive materials may be a plurality of layers of memory cells and a plurality of layers of select transistors. The first conductive materials may include layers corresponding to dummy memory cells.

Although it has been described in FIGS. 4-6 that three NAND strings NS are connected to one bit line BL, embodiments are not limited thereto. For example, "m" NAND strings NS may be connected to one bit line BL in the memory block BLKi_1 where "m" may be a positive integer. In this case, the number of the first conductive materials extending in the first direction and the number of the doping regions 311-314 serving as common source lines CSL may be determined according to the number of the NAND strings NS connected to one bit line BL.

Although it has been described in FIGS. 4-6 that three NAND strings NS are connected to one conductive material extending in the first direction, embodiments are not limited thereto. For example, "n" NAND strings NS may be connected to one conductive material extending in the first direction where "n" may be a positive integer. In this case, the number of the second conductive materials 331-333 extending in the third direction may determined according to the number of the NAND strings NS connected to one first conductive material.

As illustrated in FIGS. 4-6, a cross-sectional area of the pillar 113 according to the first and third directions may be smaller as the pillar 113 is closer to the substrate 111. For example, the cross-sectional area of the pillar 113 according to the first and third directions may be varied by process characteristics or errors. For example, the pillar 113 may be formed by providing silicon materials and insulating materials in a hole formed by etching. As the etched depth increases, the area of the hole formed by the etching according to the first and third directions may be reduced. The cross-sectional area of the pillar 113 according to the first and third directions may be reduced the closer the pillar is to the substrate 111.

The pillar 113 may include the first sub-insulation layer 117 serving as a tunneling insulation layer, the second sub-insulation layer 118 serving as a charge storage layer, and the third sub-insulation layer 119 serving as a blocking insulation layer. Due to a voltage difference between the gate (or control gate) and the surface layer 114 serving as a second-direction body, an electric field may be formed between the gate (or control gate) and the surface layer 114. The formed electric field may be distributed into the first to third sub-insulation layers 117-119.

An electrical field distributed in the first sub-insulation layer 117 may cause Fowler-Nordheim tunneling. Due to the electric field distributed in the first sub-insulation layer 117, a memory cell MC may be programmed or erased. The amount of charges trapped in the charge storage layer 118 upon program operation or the amount of change discharged from the charge storage layer upon erase operation may be determined by the electric field distributed in the first insulation layer 117.

The electric field may be distributed in the first to third sub-insulation layers 117-119 based on electrostatic capacitances of the first to third sub-insulation layers 117-119. As the width of the pillar 113 decreases, an area ratio of the first sub-insulation layer 117 to the third sub-insulation layer 119 may decrease. As the area ration of the first sub-insulation layer 117 to the third sub-insulation layer 119 decreases, a ratio of the electrostatic capacitance of the first sub-insulation layer 117 to the electrostatic capacitance of the third sub-insulation layer 119 may decrease. As the ratio of the electrostatic capacitance of the first sub-insulation layer 117 to the electrostatic capacitance of the third sub-insulation layer 119 decreases, the electric field distributed in the first sub insulation layer 117 may increase.

Accordingly, as the width of the pillar 113 decreases, the amount of charge trapped in the second sub-insulation layer 118 during a program operation and the amount of the change discharged from the second sub-insulation layer 118 during an erase operation may increase. That is, due to a width difference of the pillar 113, the magnitude of the tunneling effect may vary, and a variation of a threshold voltage of the memory cells MC1-MC7 may vary during a program operation or an erase operation.

In order to compensate for a difference of the tunneling effect (or variation of the threshold voltage) of the memory cells MC according to the width of the pillar 113, the driver (120 of FIG. 1) may be configured to adjust the level of a word line voltage applied to the word line WL according to the location of the word line WL. For example, the driver 120 may be configured to adjust the levels of a select voltage Vs applied to a selected word line, an unselect voltage Vus applied to an unselected word line, and a word line erase voltage Vew applied upon erase operation.

Figure 7:
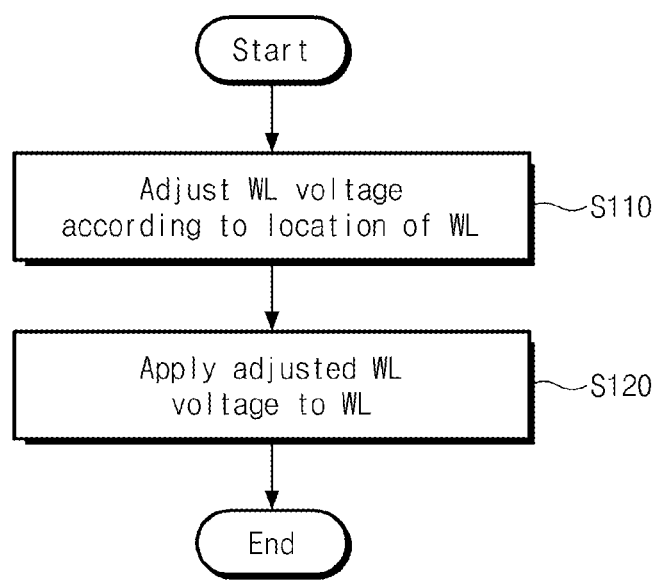

FIG. 7 is a flowchart illustrating methods of operating a driver 120 of FIG. 1. Referring to FIGS. 1 and 7, in operation S110, a word line voltage may be adjusted according to the location of the word line WL. For example, the level of the word line voltage may be different according to a distance between the string select line SSL and the word line WL. In operation S120, the adjusted word line voltage may be applied to the word line WL.

Figure 9:
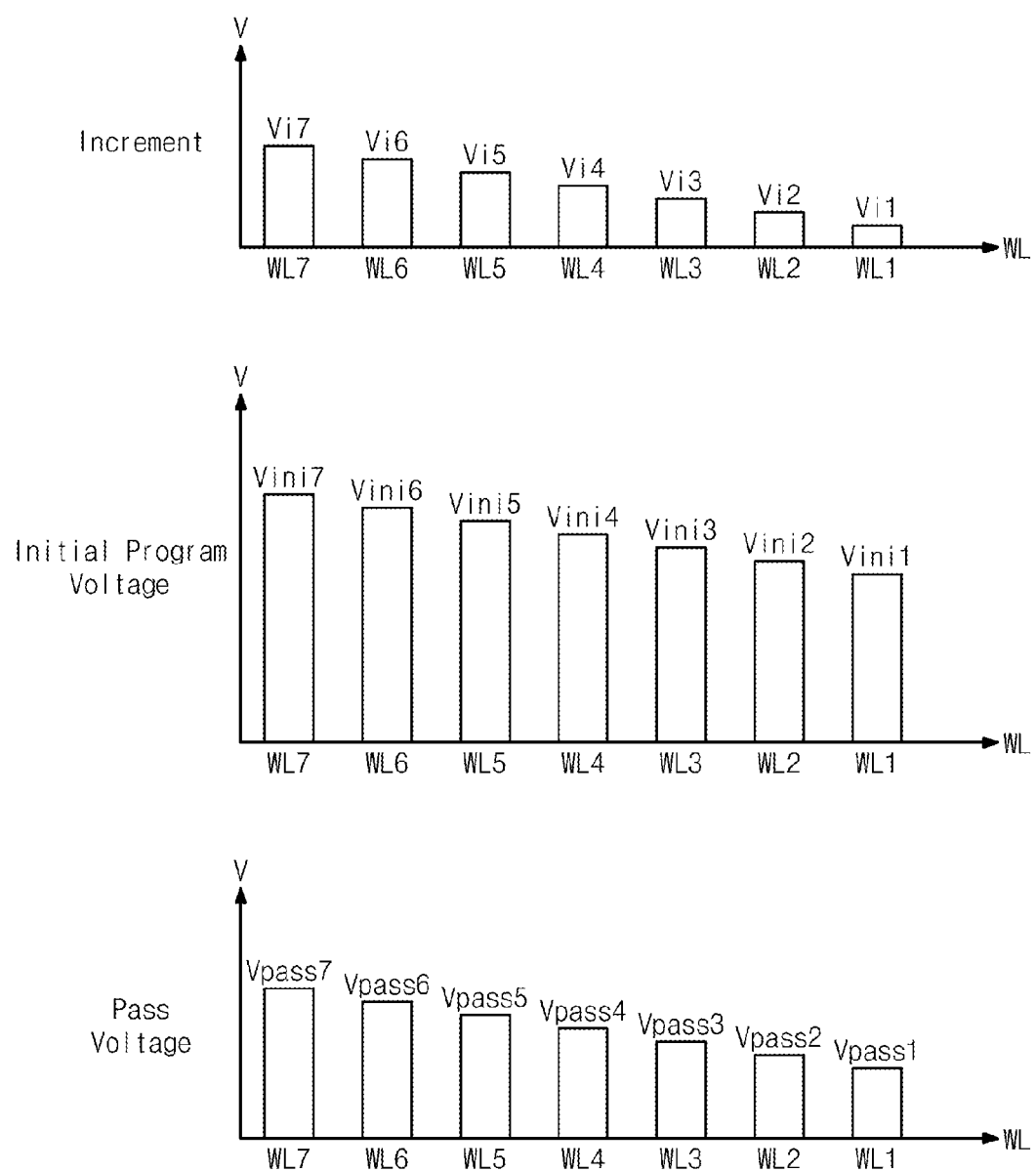

FIG. 8 is a table illustrating program operation voltage conditions according to the operation methods of FIG. 7. FIG. 9 includes 3 graphs illustrating example voltage levels of the voltages of FIG. 8. In FIG. 9, the horizontal axis represents word lines WL and the vertical axis represents voltage V. Referring to FIGS. 8 and 9, during a program operation, a program voltage Vpgm may be applied to a selected word line WL and a pass voltage Vpass may be applied to an unselected word line WL.

The program voltage Vpgm may include an initial program voltage Vini and an increment. When the program operation starts, the level of the program voltage Vpgm may be set to the level of the initial program voltage Vini. Whenever a program operation is looped, the level of the program voltage Vpgm may increase by a corresponding increment. The program operation may be performed, for example, based on an Incremental Step Pulse program (ISPP). For example, the level of the initial program voltage Vini may be adjusted according to the location of the selected word line WL. The level of the initial program voltage Vini may be set according to a distance between the string select line SSL and the selected word line WL. First to seventh initial program voltages Vini1-Vini7 may correspond to the first through seventh word lines WL1-WL7.

For example, as the distance between the word line WL and the string select line SSL increases, the level of the initial program voltage Vini may decrease. As the distance between the string select line SSL and the word line WL increases, the width of a pillar region corresponding to the word line WL may decrease. As the distance between the string select line SSL and the word line WL increases, the tunneling effect (or threshold voltage variation) may increase. When the level of the initial program voltage Vini is adjusted (e.g., reduced) according to the increase of the distance between the word line WL and the string select line SSL, the tunneling effect (or threshold voltage variation) corresponding to the word lines WL1-WL7 may be equalized and/or improved.

For example, the increment may be determined according to the location of the selected word line WL. For example, the size of the increment may be determined according to the distance between the string select line SSL and the selected word line. First to seventh increments Vi1-Vi7 may correspond to first to seventh word lines WL1-WL7, respectively. For example, as the distance between the word line WL and the string select line SSL increases, the increment Vi may decrease. When the increment is reduced according to the increase of the distance between the word line WL and the string select line SSL, the tunneling effect (or threshold voltage variation) corresponding to the word lines WL1-WL7 may be equalized and/or improved.

When the tunneling effect (or threshold voltage variation) according to the word lines WL1-WL7 is equalized and/or improved, a program speed according to the word lines WL1-WL7 may be equalized and/or improved. Also, a threshold voltage distribution of programmed memory cells MC may be reduced. Accordingly, the reliability of a nonvolatile memory device (e.g, the nonvolatile memory device 100 of FIG. 1) may be improved. For example, the equalization and/or improvement of the program speed may be performed by accelerating the program speed of the memory cells corresponding to word lines adjacent to the string select line SSL. For example, the equalization and/or improvement of the program speed may be performed by stabilizing (or reducing) the program speed of the memory cells corresponding to the word lines adjacent to the ground select line GSL.

For example, the initial program voltages Vini and increments Vi of different levels may be applied to the word lines WL1-WL7. The program voltages Vpgm of different levels may be applied to the word lines WL1-WL7. For example, the word lines WL1-WL7 may be divided into a plurality of groups, and the initial program voltages Vini and increments of different levels may be applied to the groups of the divided word lines. The program voltages Vpgm of different levels may be applied to the group of the divided word lines. For example, the level of the pass voltage Vpass may be controlled according to the location of the unselected word line WL. For example, the level of the pass voltage Vpass may be adjusted according to a distance between the string select line SSL and the selected word line WL. First to seventh pass voltages Vpass1-Vpass7 may correspond to the first to seventh word lines WL1-WL7, respectively.

As described above, as the distance between the string select line SSL and the word line WL increases, the tunneling effect (or threshold voltage variation) of the memory cell corresponding to the word line WL may increase. As the distance between the string select line SSL and the word line WL increases, the probability that a program disturbance by a pass voltage Vpass is generated in the memory cell corresponding to the word line WL may increase. When the level of the pass voltage Vpass is adjusted (e.g., different) according to the location of the word line WL, more specifically, the distance between the string select line SSL and the word line WL, the program disturbance by the pass voltage Vpass may be prevented or reduced.

For example, as the distance between the string select line SSL and the word line WL increases, the level of the pass voltage Vpass may decrease. The tunneling effect (threshold voltage variation) of the memory cell increases, the level of the pass voltage Vpass may decrease. Accordingly, the program disturbance by the pass voltage Vpass may be prevented or reduced. The reliability of the nonvolatile memory device 100 may be improved. For example, pass voltages Vpass of different levels may be applied to the word lines WL1-WL7, respectively. The word lines WL1-WL7 may be divided into a plurality of groups and the pass voltages Vpass of different levels may be applied to the groups of the divided word lines.

Figures 10, 11:
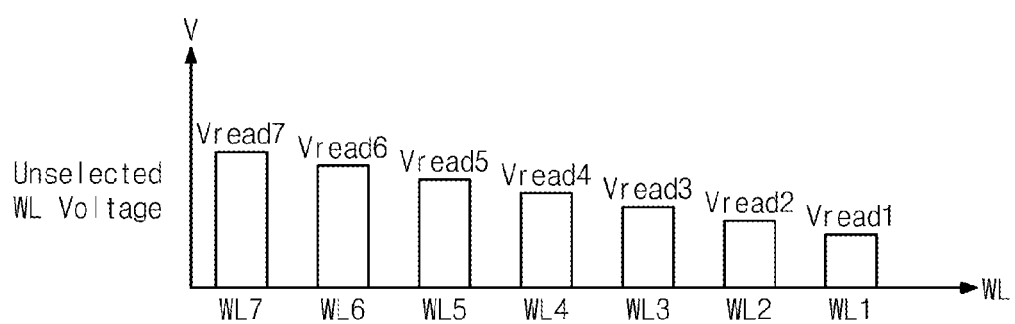

FIG. 10 is a table illustrating read operation voltage conditions according to the operation methods of FIG. 7. FIG. 11 is a graph illustrating example voltage levels of the voltages shown in FIG. 10. In FIG. 11, the horizontal axis represents word lines WL and the vertical axis represents voltage V. Referring to FIGS. 10 and 11, during a read operation, an unselect read voltage Vread may be applied to an unselected word line WL. The unselect read voltage Vread may also cause a program disturbance. When the level of the unselect read voltage Vread is determined according to a distance between the string select line SSL and the word line WL, the program disturbance by the unselect read voltage Vread may be prevented or reduced. For example, as the distance between the string select line SSL and the word line WL increases, the level of the unselect read voltage Vread may decrease. As the tunneling effect (or variation of the threshold voltage) of the memory cells MC increases, the level of the unselect read voltage Vread may decrease. The program disturbance by the unselect read voltage Vread may be prevented or reduced.

For example, the first to seventh unselect read voltages Vread1-Vread7 may correspond to the first to seventh word lines WL1-WL7, respectively. For example, unselect read voltages Vread of different levels may be applied to the word lines WL1-WL7. The word lines WL1-WL7 may be divided into a plurality of groups and the unselect read voltages Vread of different levels may be applied to the groups of the divided word lines.

Figures 12, 13:
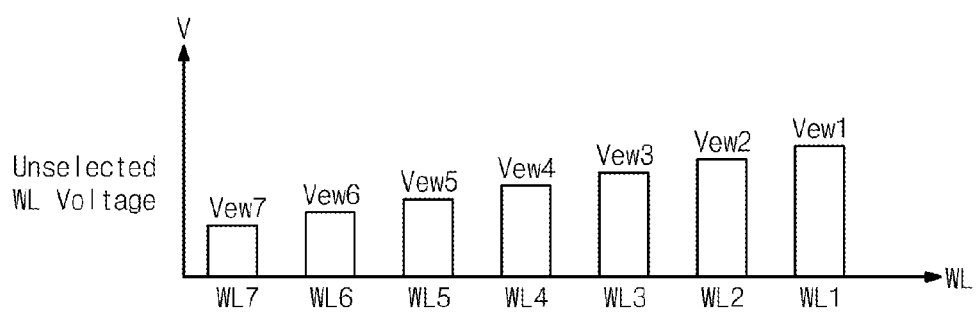

FIG. 12 is a table illustrating erase operation voltage conditions according to the operation methods of FIG. 7. FIG. 13 is a graph illustrating example voltage levels of the voltages of FIG. 12. In FIG. 13, the horizontal axis represents word lines WL, and the vertical axis represents voltage V. Referring to FIGS. 12 and 13, during an erase operation, a word line erase voltage Vew may be applied to word lines WL. For example, the word line erase voltage Vew may be a voltage having a level equal to or similar to that of a ground voltage Vss. During the operation, word line erase voltages Vew1-Vew7 may be applied to the word lines WL1-WL7, respectively, and an erase voltage Vers (not shown) may be applied to the surface layer 114. The erase voltage Vers may be a high voltage. Due to a voltage difference between the erase voltage Vers and the word line erase voltages Vew1-Vew7, Fowler-Nordheim tunneling may be generated in memory cells. Due to the Fowler-Nordheim tunneling, the memory cells MC may be erased.

As a distance between a string select line SSL and a word line WL increases, the tunneling effect (or variation of a threshold voltage) of a memory cell MC corresponding to the word line WL may increase. During an erase operation, when the level of the word line erase voltage Vew is determined according to the distance between the string select line SSL and the word line WL, the tunneling effect (or variation of the threshold voltage) corresponding to the string select line SSL and the word line WL may be equalized and/or improved.

For example, as the distance between the string select line SSL and the word line WL increases, the level of the word line erase voltage Vew may increase. As the tunneling effect (or variation of the threshold voltage) of the memory cells MC increases, the level of the word line erase voltage Vew may increase. The tunneling effect (or variation of the threshold voltage) of the memory cells MC according to the word lines WL1-WL7 may be equalized and/or improved. The threshold voltage distribution of the memory cells MC in an erase state may be reduced and the reliability of the nonvolatile memory device 100 may be improved.

For example, word line erase voltages Vew of different levels may be applied to the word lines WL1-WL7. The word lines WL1-WL7 may be divided into a plurality of groups and the word line erase voltages Vew of different levels may be applied to the groups of the divided word lines. For example, the variation direction of the word line erase voltage WL according to the distance between the string select line SSL and the word line WL may be apposite to the variation direction of a select voltage such as a program voltage Vpgm according to the distance between the string select line SSL and the word line WL, and an unselect voltage such as a pass voltage Vpass or an unselect read voltage Vread.

For example, the first to seventh word line erase voltages Vew1-Vew7 may be a voltage level that is higher than the ground voltage Vss. The first to seventh word line erase voltages Vew1-Vew7 may have a voltage level lower than the ground voltage Vss. A portion of the first to seventh word line erase voltages Vew1-Vew7 may have a level higher than the ground voltage Vss, and a different portion of the first to seventh word line erase voltages Vew1-Vew7 may have a level lower than the ground voltage Vss. One of the first to seventh word line erase voltage Vew1-Vew7 may be the ground voltage Vss.

Figure 14:
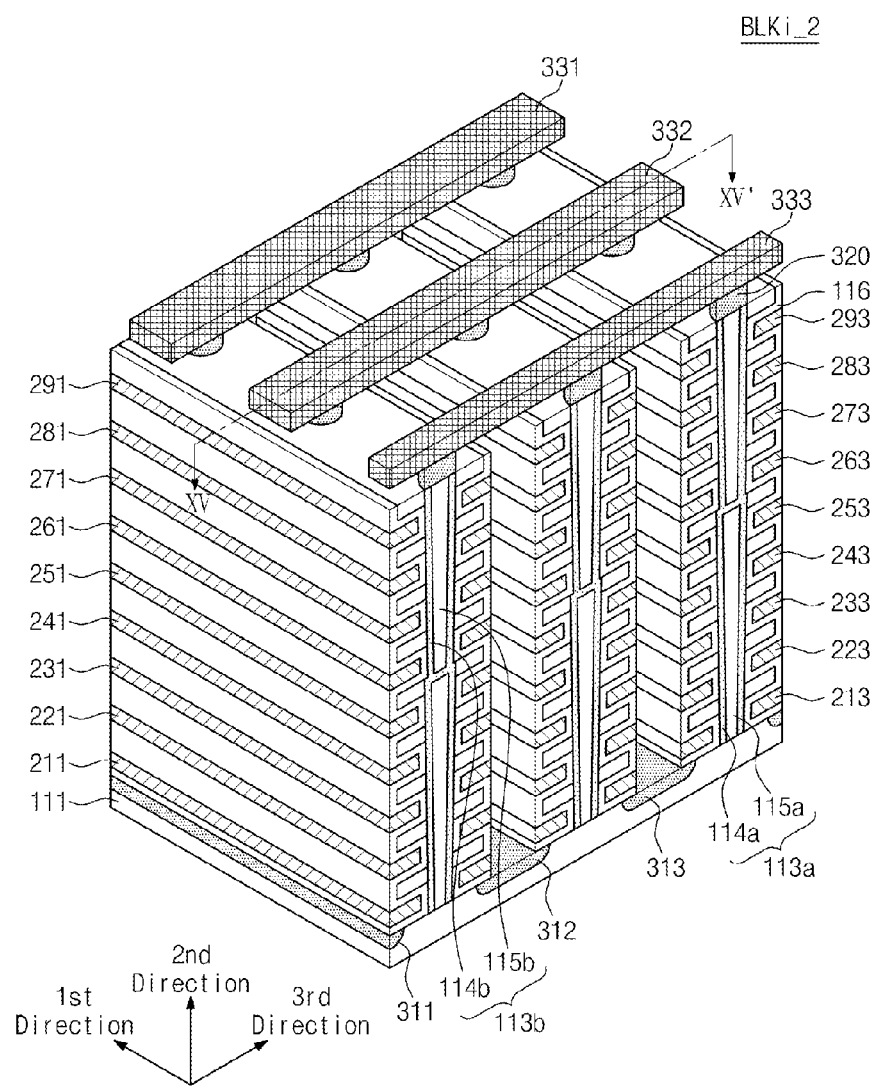
Figure 15:
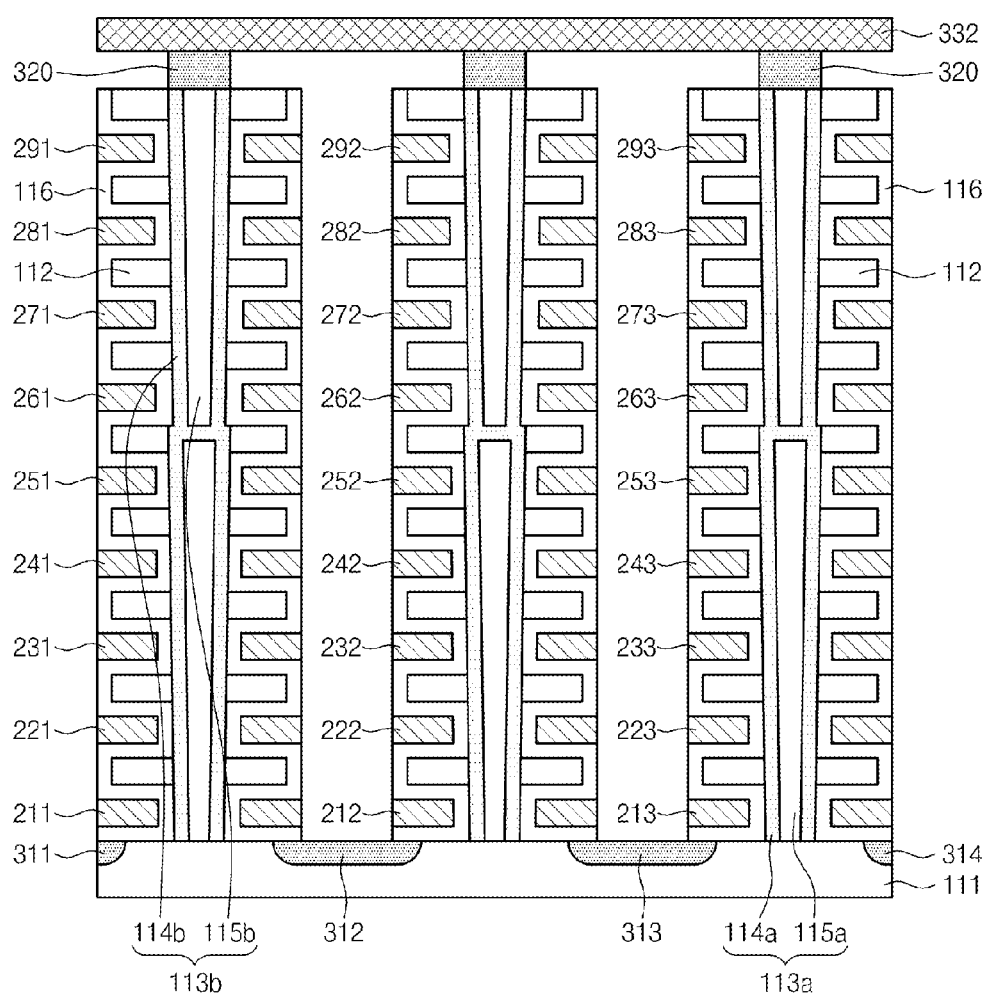

FIG. 14 is a perspective view illustrating a structure of a memory block BLKi_2 corresponding to the memory block of FIG. 3 according to example embodiments. FIG. 15 is a cross-sectional view taken along the line XV-XV' of the memory block BLKi_2 of FIG. 14. Except that one pillar is configured with a first sub-pillar 113a and a second sub-pillar 113b, the memory block BLKi_2 may be similar to the memory block BLKi_1 described with reference to FIGS. 4-13. Accordingly, detailed description of the same configuration and/or elements may be omitted herein.

Referring to FIGS. 3, 14, and 15, a first sub-pillar 113a may be provided on the substrate 111. For example, a surface layer 114a of the first sub-pillar 113a may include a p-type silicon material. The surface layer 114a of the first sub-pillar 113a may serve as a second-direction body. An internal layer 115a of the first sub-pillar 113a may be formed of an insulating material. A second sub-pillar 113b may be provided on the first sub-pillar 113a. For example, a surface layer 114b of the second sub-pillar 113b may include a p-type silicon material. The surface layer 114b of the second sub-pillar 113b may serve as a second-direction body. An internal layer 115b of the second sub-pillar 113b may be formed of an insulating material. For example, the surface layer 114a of the first sub-pillar 113a and the surface layer 114b of the second sub-pillar 113b may be connected to each other. As illustrated in FIGS. 14 and 15, the surface layer 114a of the first sub-pillar 113a and the surface layer 114b of the second sub-pillar 113b may be connected to each other through a silicon pad (SIP).

For example, as a distance from the string select line SSL increases, the width of the first sub-pillar 113a may decrease. As the distance from the string select line SSL increases, the width of the second sub-pillar 113b may decrease. The variation of the widths of the first and second pillars 113a and 113b may cause the variation of the tunneling effect (or variation of the threshold voltage) of the memory cells MC. When a level of the word line voltage is adjusted according to the length between the string select line SSL and the word line WL, a difference of the tunneling effect (or variation of the threshold voltage) according to the distance between the string select line SSL and the word line WL may be compensated and/or reduced.

Figure 16:
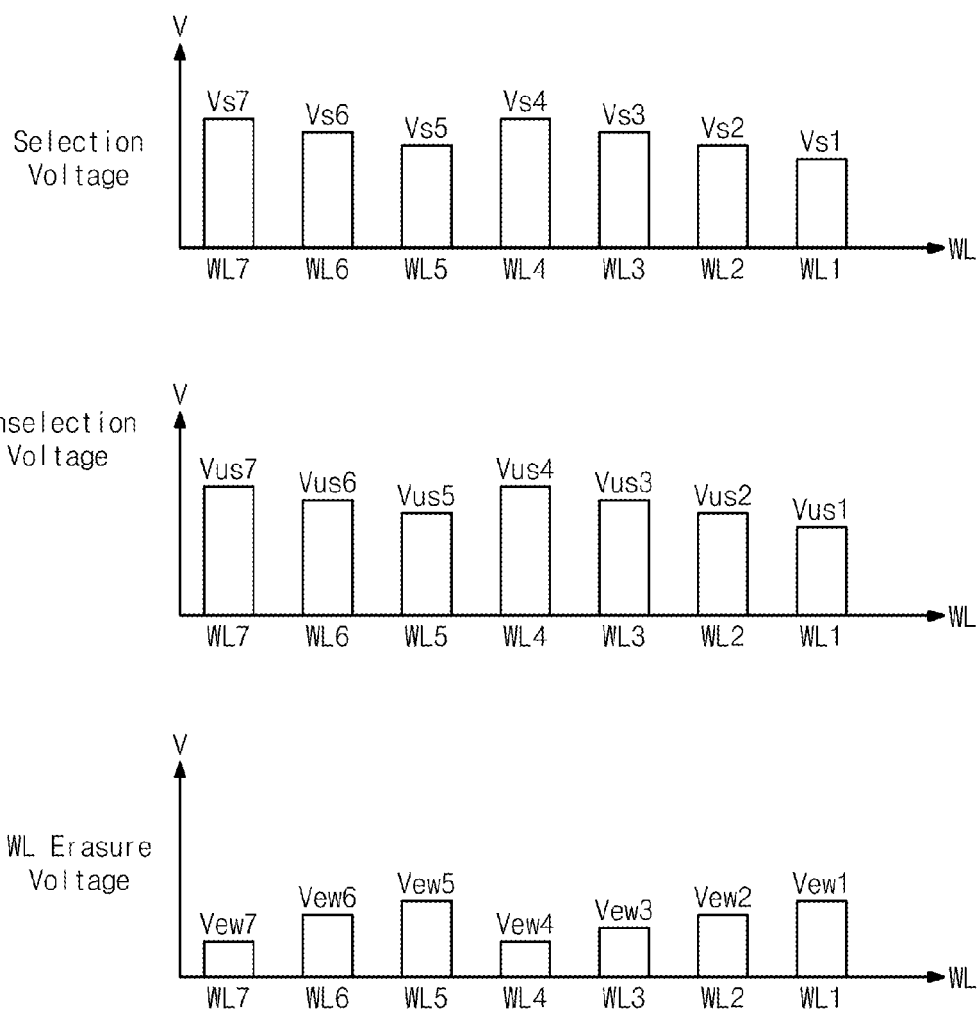

FIG. 16 includes 3 graphs illustrating word line voltages applied to the word lines WL1-WL7 of the memory block BLKi_2 of FIGS. 3, 14, and 15. Referring to FIGS. 3, 14, and 16, the level of the word line voltage may be adjusted according to a distance between the string select line SSL and the word line WL. For example, as the distance between the string select line SSL and the word line WL increases, the level of a select voltage Vs may decrease and increase, and then decrease again (e.g., sequentially).

For example, as the distance between the string select line SSL and the word line WL increases, the width of the second sub-pillar 113b may decrease. In order to compensate for the reduction of the width of the second sub-pillar 113b, the level of the select voltage Vs may be reduced (e.g., sequentially). When the distance between the string select line SSL and the word line WL increases, and the fourth word line WL4 is selected, then the width of the pillar may increase from about the width of a lower portion of the second sub-pillar 113b to about the width of an upper portion of the first sub-pillar 113a. The level of the select voltage Vs4 may also increase. Thereafter, when the distance between the string select line SSL and the word line WL increases, the width of the first sub-pillar 113a may decrease. In order to compensate for the reduction of the width of the first sub-pillar 113a, the level of the select voltage Vs may be reduced (e.g., sequentially). For example, the select voltage Vs may include a program voltage Vpgm including an initial program voltage Vini and an increment Vi.

For example, as the distance between the string select line SSL and the word line WL increases, the level of an unselect voltage Vus may decrease and increase, and then decrease again (e.g., sequentially). For example, the first to seventh unselect voltages Vus1-Vus7 may correspond to the first to seventh word lines WL1-WL7, respectively. For example, the variation direction of the unselect voltage Vus according to the distance between the string select line SSL and the word line WL may correspond to the variation direction of the select voltage Vs. The unselect voltage Vus may include a pass voltage Vpass and an unselect read voltage Vread.

For example, as the distance between the string select line SSL and the word line WL increases, the level of the word line erase voltage Vew may increase and decrease, and then increase again (e.g., sequentially). For example, the first to seventh word line erase voltages Vew1-Vew7 may correspond to the first to seventh word lines WL1-WL7, respectively. For example, the variation direction of the word line erase voltage Vew according to the distance between the string select line SSL and the word line WL may be opposite to the variation direction of the select voltage Vs and the unselect voltage Vus.

For example, the first to seventh word line erase voltages Vew1-Vew7 may have a level higher than the ground voltage Vss. The first to seventh word line erase voltages Vew1-Vew7 may have a level lower than the ground voltage Vss. A portion of the first to seventh word line erase voltages Vew1-Vew7 may have a level higher than the ground voltage Vss, and a different portion of the first to seventh word line erase voltages Vew1-Vew7 may have a level lower than the ground voltage Vss. One of the first to seventh word line erase voltages Vew1-Vew7 may be the ground voltage Vss. For example, the word lines WL1-WL7 may be divided into a plurality of groups, and the levels of the select voltage Vs, the unselect voltage Vus, and the word line erase voltage Vew may be adjusted by unit of group of the divided word lines, respectively.

Figure 17:
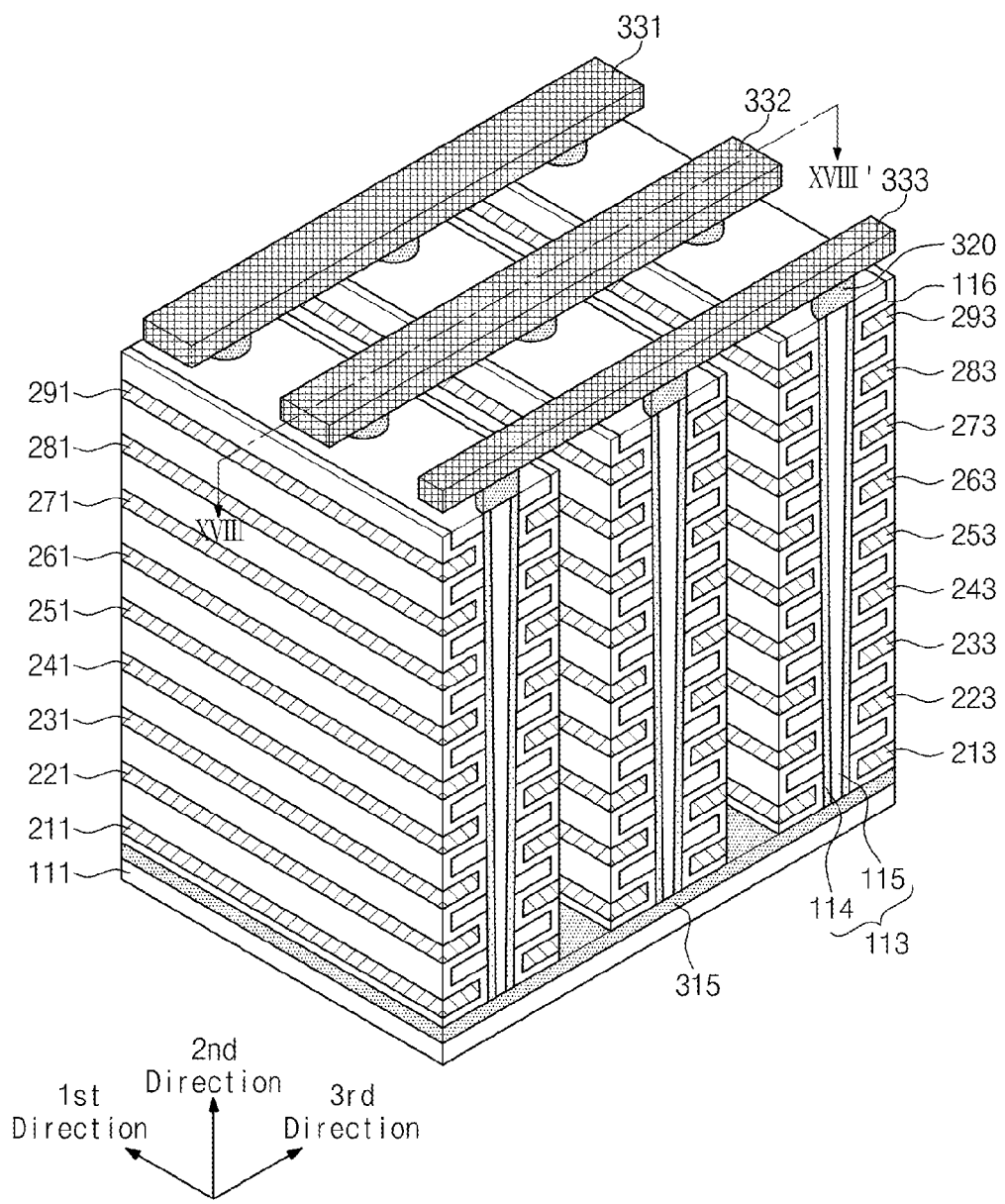
Figure 18:
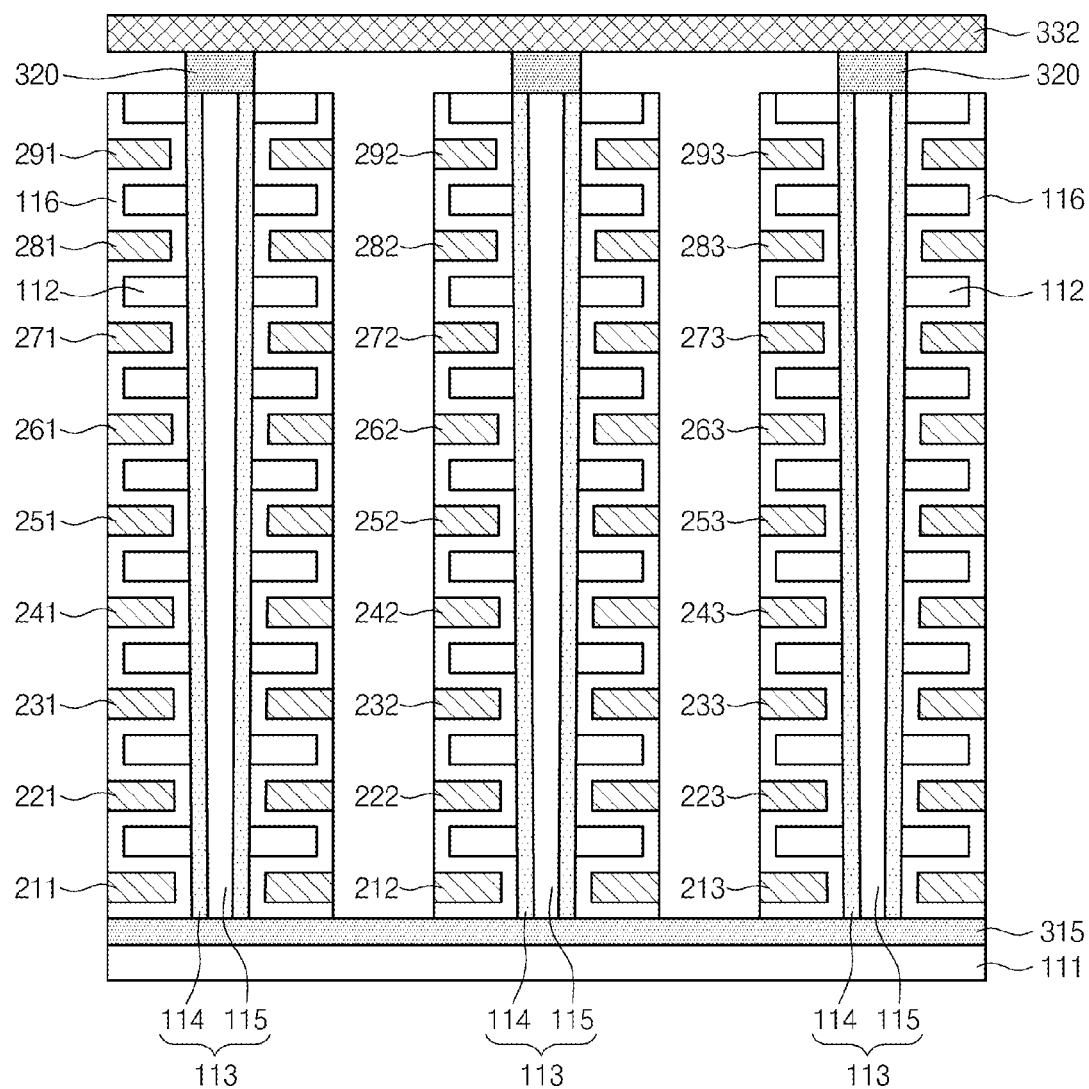

FIG. 17 is a diagram illustrating a structure of a memory block BLKi_3 corresponding to the memory block of FIG. 3 according example embodiments of the inventive concepts. FIG. 18 is a cross-sectional view taken along the line XVIII-XVIII' of the memory block BLKi_3 of FIG. 17. Except that an n-type doping region 315 of a common source line CLS is provided in a plate form, the memory block BLKi_3 may be configured similarly to the memory block BLKi_1 described with reference to FIGS. 4-13. The levels of the word line voltages may also be adjusted similarly to those described with reference to FIGS. 4-13. For example, the n-type doping region 315 may be provided as an n-type well.

For example, the levels of the select voltage and the unselect voltage Vus may be reduced (e.g., sequentially) according to a distance between the string select line SSL and the word line WL. The level of the word line erase voltage Vew may increase (e.g., sequentially) according to the distance between the string select line SSL and the word line WL. For example, the word lines WL1-WL7 may be divided into a plurality of groups, and the level of the word line voltage may be adjusted by unit of groups of the divided word lines.

Figure 19:
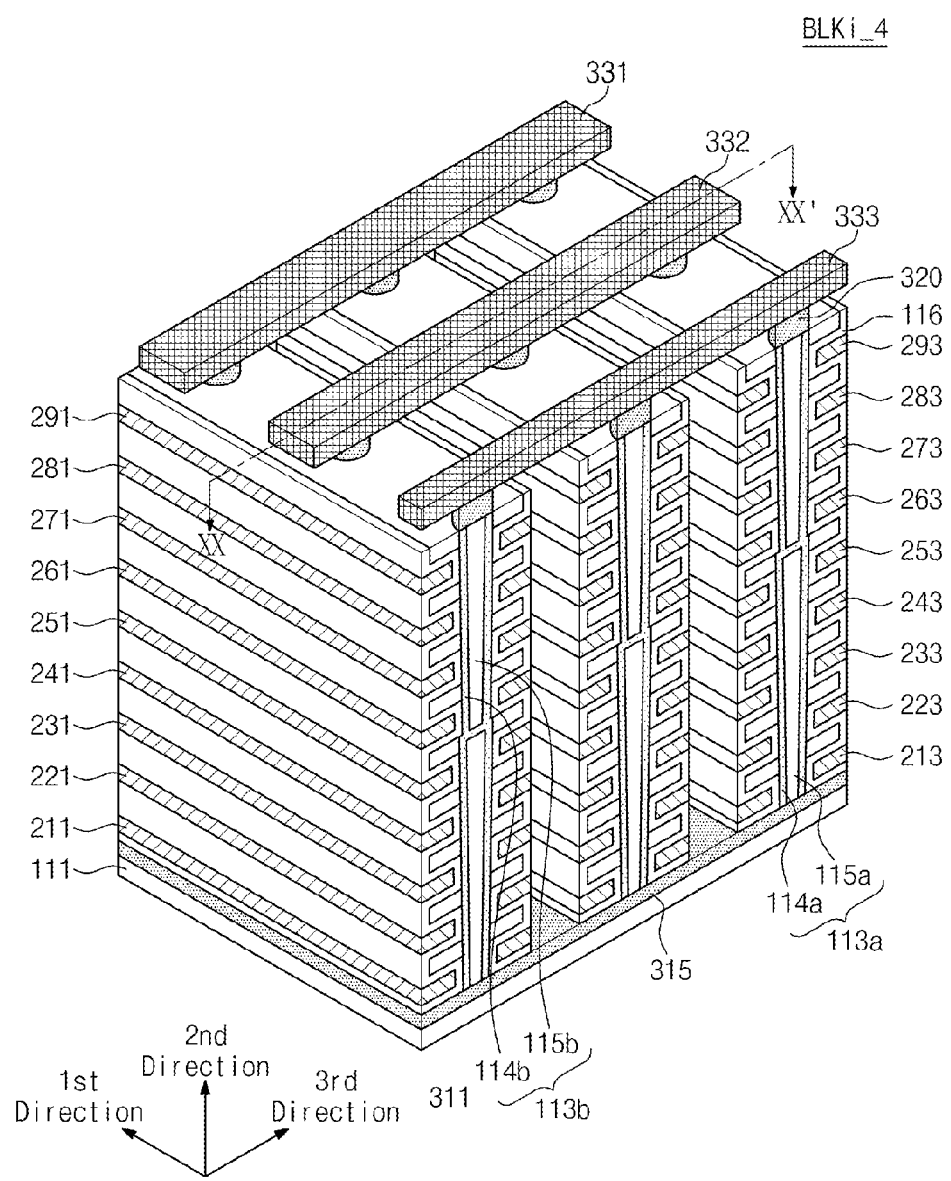
Figure 20:
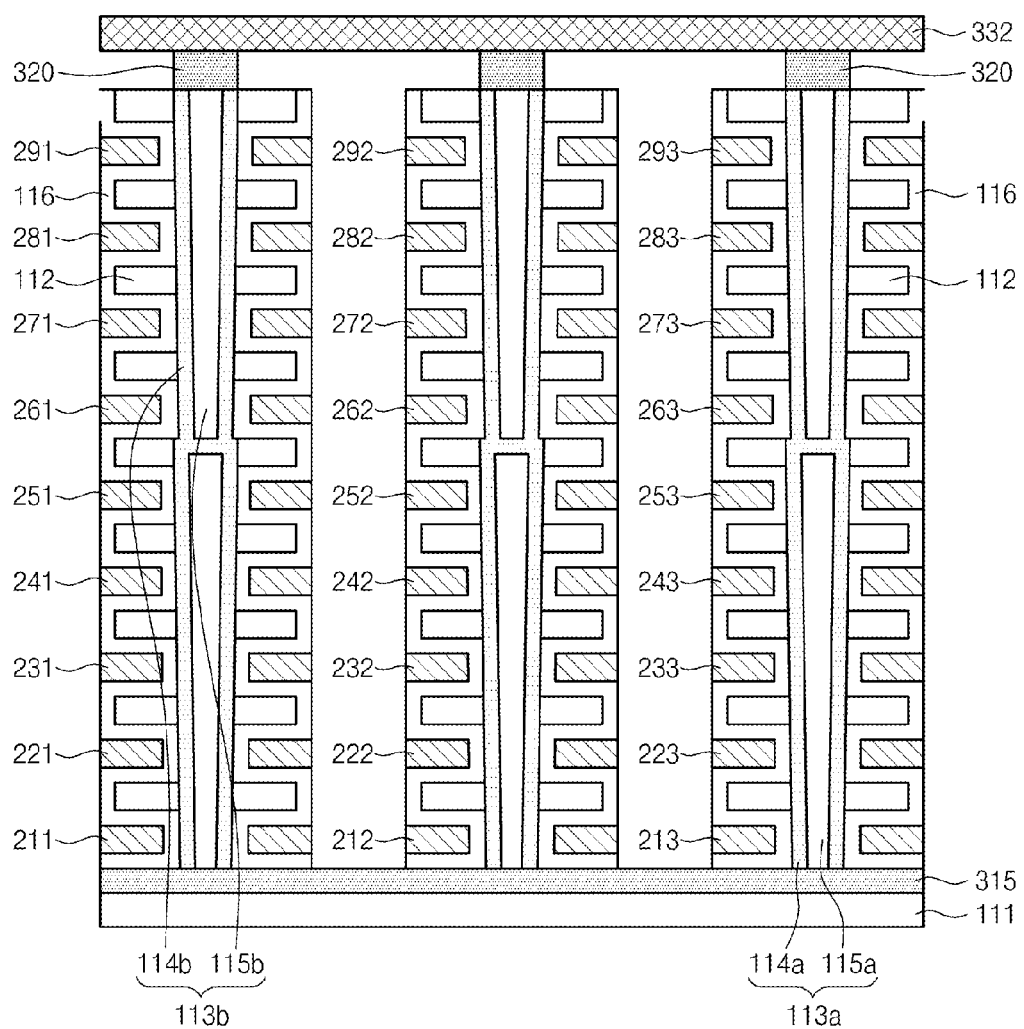

FIG. 19 is a perspective view illustrating a structure of a memory block BLKi_4 corresponding to the memory block of FIG. 3 according to example embodiments of the inventive concepts. FIG. 20 is a cross-sectional view taken along the line XX-XX' of the memory block BLKi_4 of FIG. 19. Except that a common source line CLS is provided as an n-well 315 of a plate type, the memory block BLKi_4 may be configured similarly to the memory block BLKi_2 described with reference to FIGS. 14-16. The levels of the word line voltages may also be adjusted similarly to those described with reference to FIGS. 14-16.

For example, the levels of the select voltage and the unselect voltage Vus may decrease and increase, and then decrease again (e.g., sequentially), according to a distance between the string select line SSL and the word line WL. The level of the word line erase voltage Vew may increase and decrease, and then increase (e.g., sequentially) according to the distance between the string select line SSL and the word line WL. For example, the word lines WL1-WL7 may be divided into a plurality of groups, and the level of the word line voltage may be adjusted by unit of groups of the divided word lines.

Figure 21:
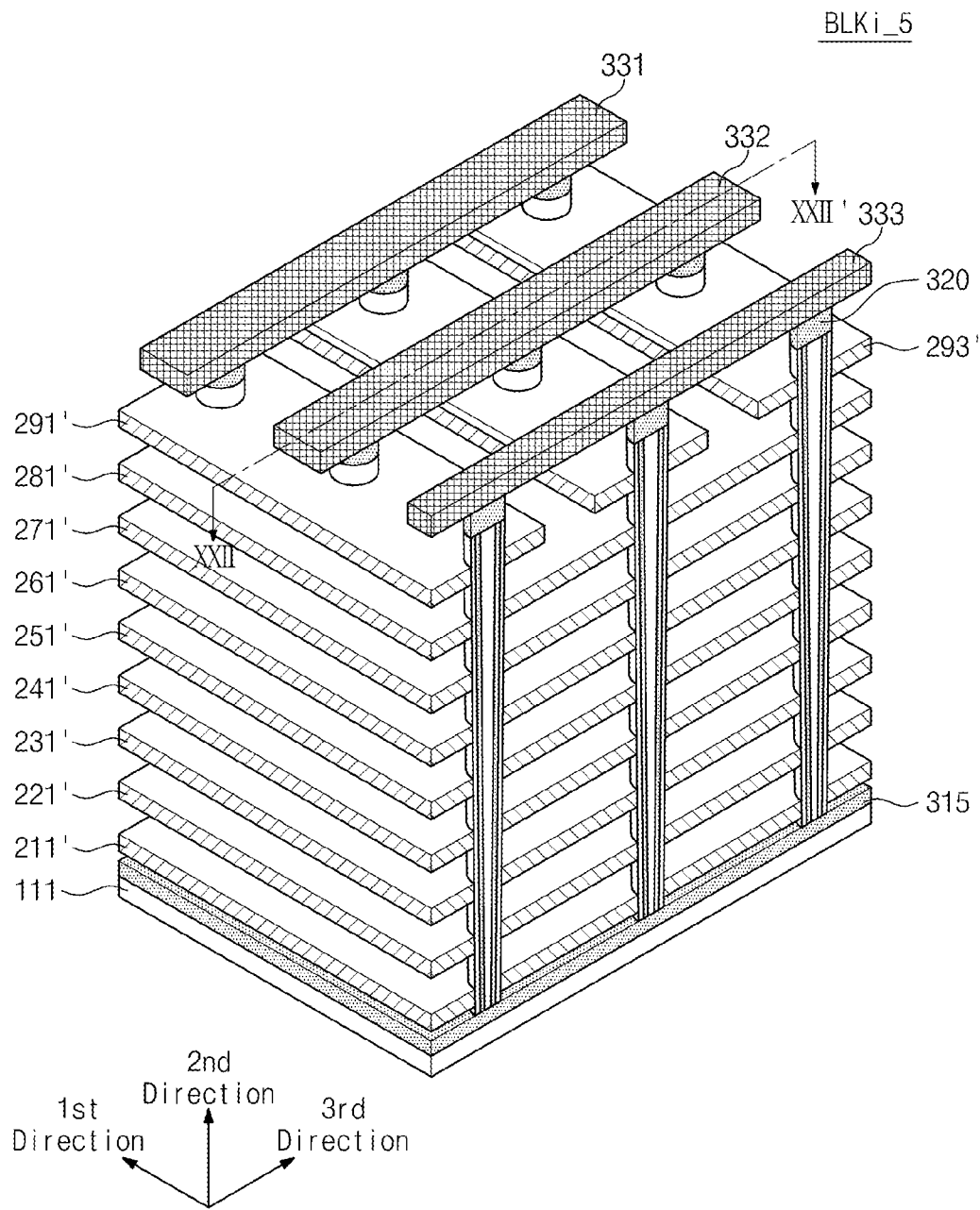
Figure 22:
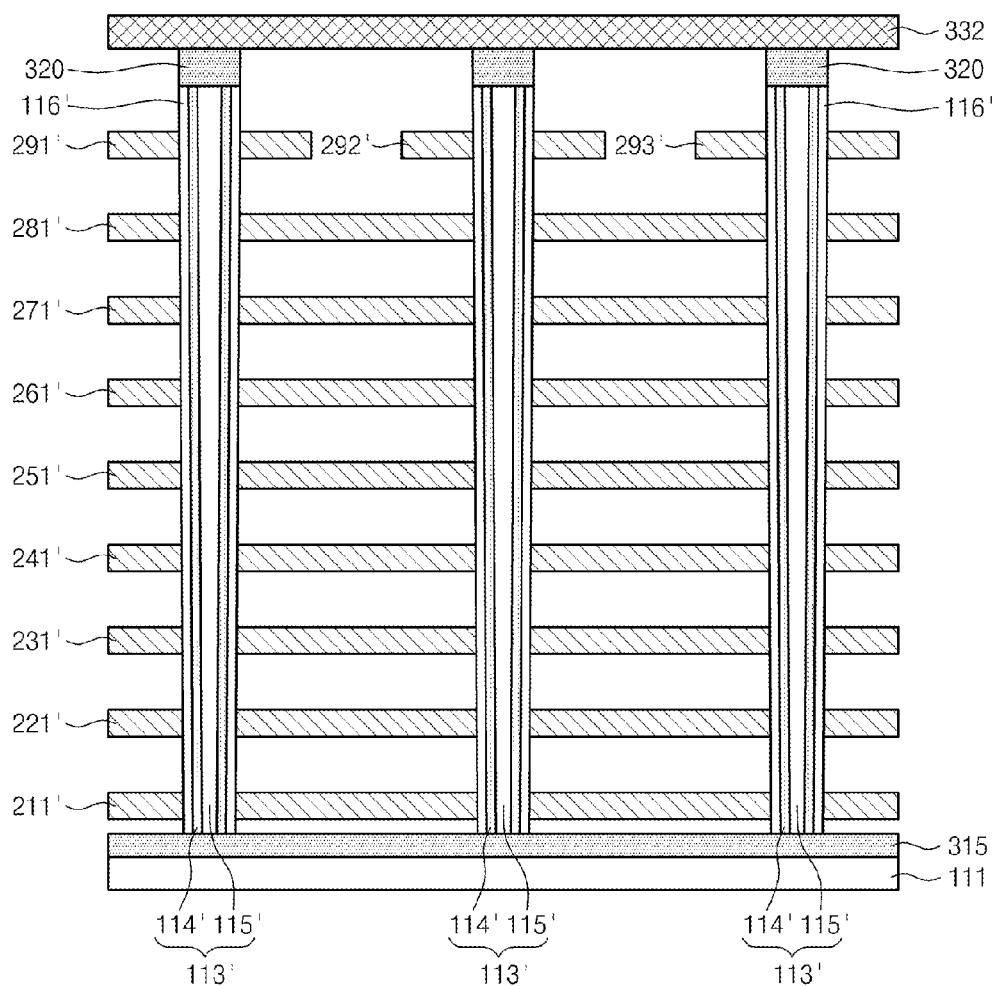

FIG. 21 is a perspective view illustrating a structure of a memory block BLKi_5 corresponding to the memory block of FIG. 3 according to example embodiments of the inventive concepts. FIG. 22 is a cross-sectional view taken along the line XXII-XXII' of the memory block BLKi_5 of FIG. 21. Referring to FIGS. 21 and 22, an n-type doping region 315 forming a common source line CLS may be provided in a plate form as described with reference to FIGS. 17 and 18.

A surface layer 116' of each pillar 113' may include an insulation layer. The surface layer 116' of the pillar 113' may be configured to store data similarly to the insulation layer 116 described with reference to FIG. 6. For example, the surface layer 116' may include a tunneling insulation layer, a charge storage layer, and a blocking insulation layer. An intermediate layer 114' of the pillar 113' may include a p-type silicon. The intermediate layer 114' of the pillar 113' may serve as a second-direction body. An internal layer 115' of the pillar 113' may include an insulating material.

As illustrated in FIGS. 21 and 22, the width of the pillar 113' may be changed (or reduced) according to a distance between the word line WL and the string select line SSL. Similarly to those described with reference to FIGS. 17 and 18, as the distance between the string select line SSL and the word line WL increases, the tunneling effect (or variation of a threshold voltage) may increase. In order to compensate for variation of the operation characteristics according to the variation of the width of the pillar 113', the level of the word line voltage may be adjusted according to the distance between the string select line SSL and the word line WL. For example, the level of the word line voltage applied to the memory block BLKi_5 may be adjusted similarly to those described with reference to FIGS. 17 and 18.

For example, as the distance between the string select line SSL and the word line WL increases, the levels of the select voltage Vs and the unselect voltage Vus may increase (e.g., sequentially). As the distance between the string select line SSL and the word line WL increases, the level of the word line erase voltage Vew may be reduced (e.g., sequentially). For example, the word lines WL1-WL7 may be divided into a plurality of groups, the level of the word line voltage may be adjusted by unit of groups of the divided word lines.

Figure 23:
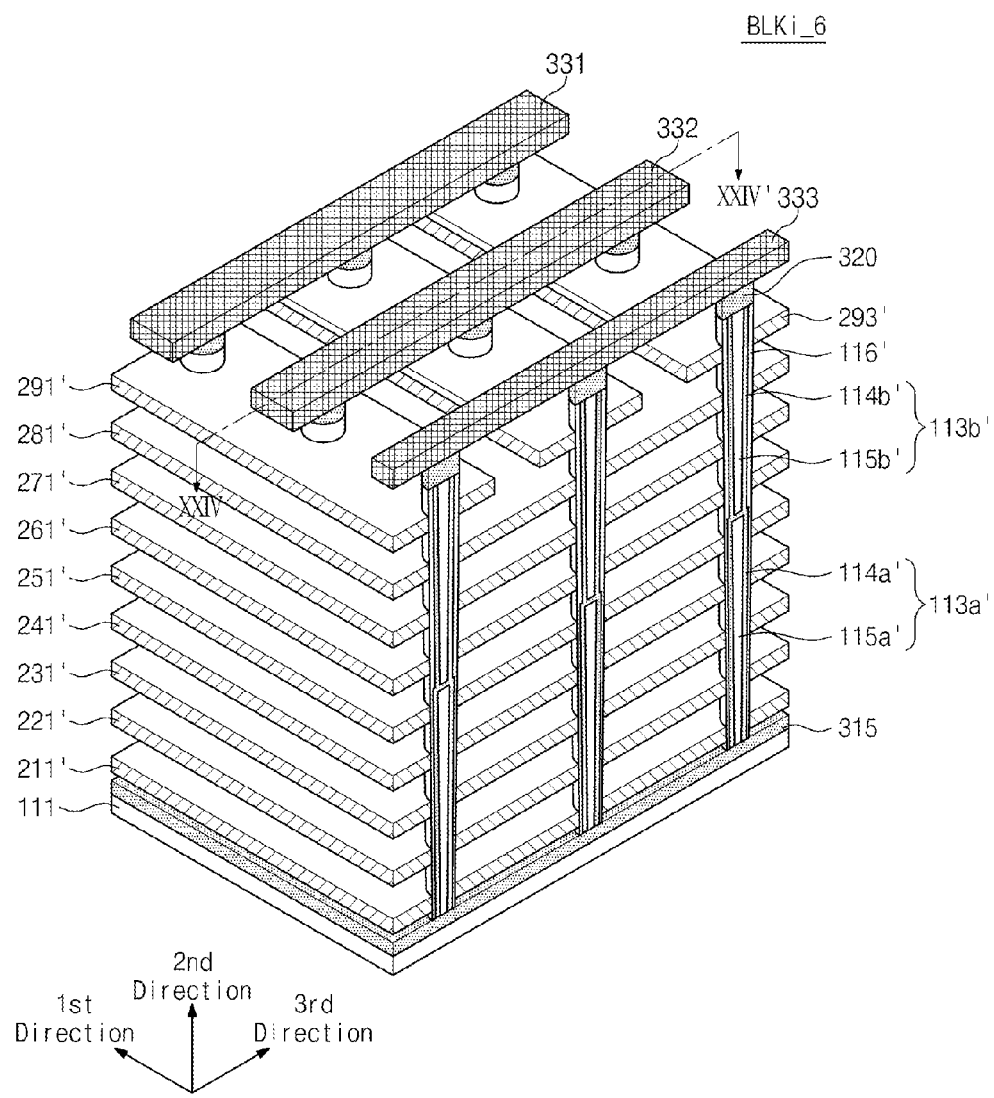
Figure 24:
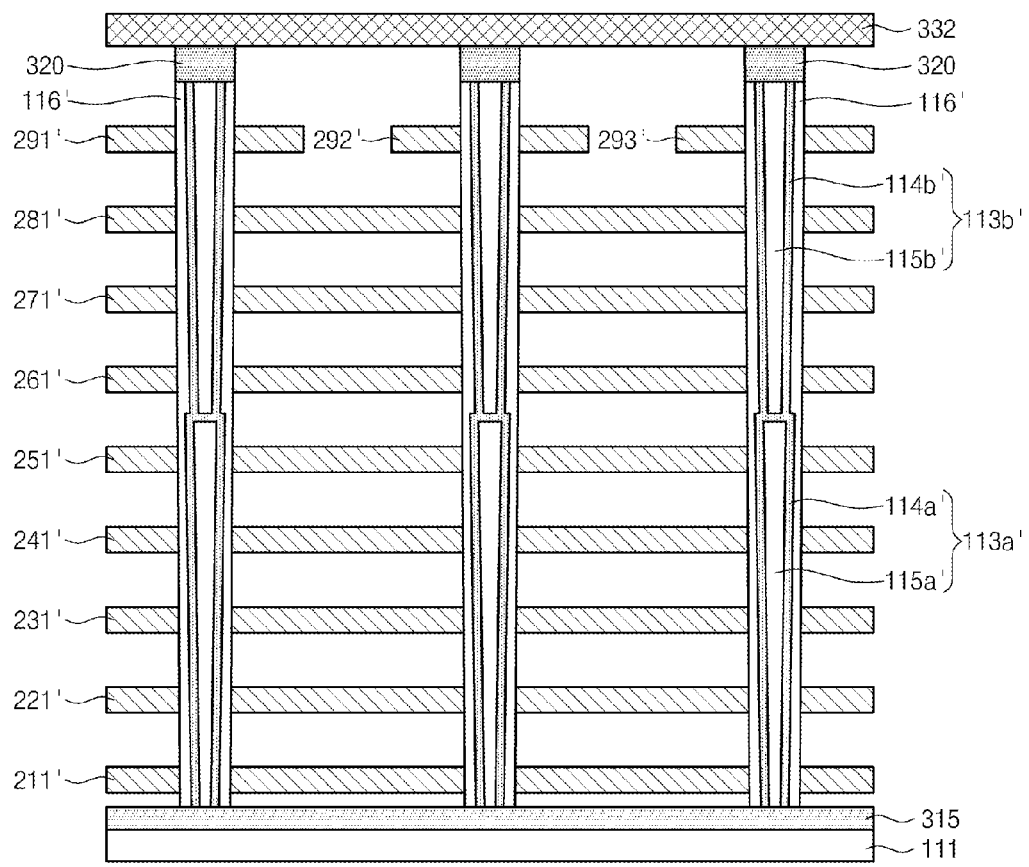

FIG. 23 is a perspective view illustrating a structure corresponding to the memory block BLKi_6 of FIG. 3 according to example embodiments of the inventive concepts. FIG. 24 is a cross-sectional view taken along the line XXIV-XXIV' of the memory block BLKi_6 of FIG. 23. Except that one pillar is configured with a first sub-pillar 113a' and a second sub-pillar 113b', the memory block BLKi_6 may be similar to the memory block BLKi_5 described with reference to FIGS. 21 and 22. Accordingly, detailed description of the same configuration and/or elements may be omitted herein.

Referring to FIGS. 3, 23, and 24, a first sub-pillar 113a' may be provided on the substrate 111. For example, a surface layer 114a' of the first sub-pillar 113a' may include a p-type silicon material. The surface layer 114a' of the first sub-pillar 113a' may serve as a second-direction body. An internal layer 115a' of the first sub-pillar 113a' may be formed of an insulating material. A second sub-pillar 113b' may be provided on the first sub-pillar 113a'. For example, a surface layer 114b' of the second sub-pillar 113b' may include a p-type silicon material. The surface layer 114b' of the second sub-pillar 113b' may serve as a second-direction body. An internal layer 115b' of the second sub-pillar 113b' may be formed of an insulating material.

For example, the surface layer 114a' of the first sub-pillar 113a' and the surface layer 114b' of the second sub-pillar 113b' may be connected to each other. As illustrated in FIGS. 23 and 24, the surface layer 114a' of the first sub-pillar 113a' and the surface layer 114b' of the second sub-pillar 113b' may be connected to each other through a p-type silicon pad.

As illustrated in FIGS. 23 and 24, a width of the first and second sub-pillars 113a' and 113b' may vary according a distance from the string select line SSL. Similarly to those described with reference to FIGS. 20 and 21, as the distance between the string select line SSL and the word line WL increases, the tunneling effect (or variation of the threshold voltage) may increase and decrease, and then increase again (e.g., sequentially). In order to compensate for the change of the operation characteristics according to the variation of the widths of the first and second sub-pillars 113a' and 113b', the level of the word line voltage may be adjusted according to the distance between the string select line SSL and the word line WL.

For example, the level of the word line voltage applied to the memory block BLKi_6 may be adjusted similarly to those described with reference to FIGS. 20 and 21. As the distance between the string select line SSL and the word line WL increases, the levels of the select voltage Vs and the unselect voltage Vus may decrease and increase, and then decrease again (e.g., sequentially). As the distance between the string select line SSL and the word line WL increases, the level of the word line erase voltage Vew may increase and decrease, and then increase again (e.g., sequentially). For example, the word lines WL1-WL7 may be divided into a plurality of groups, and the level of the word line voltage may be adjusted by unit of groups of the divided word lines.

Figure 25:
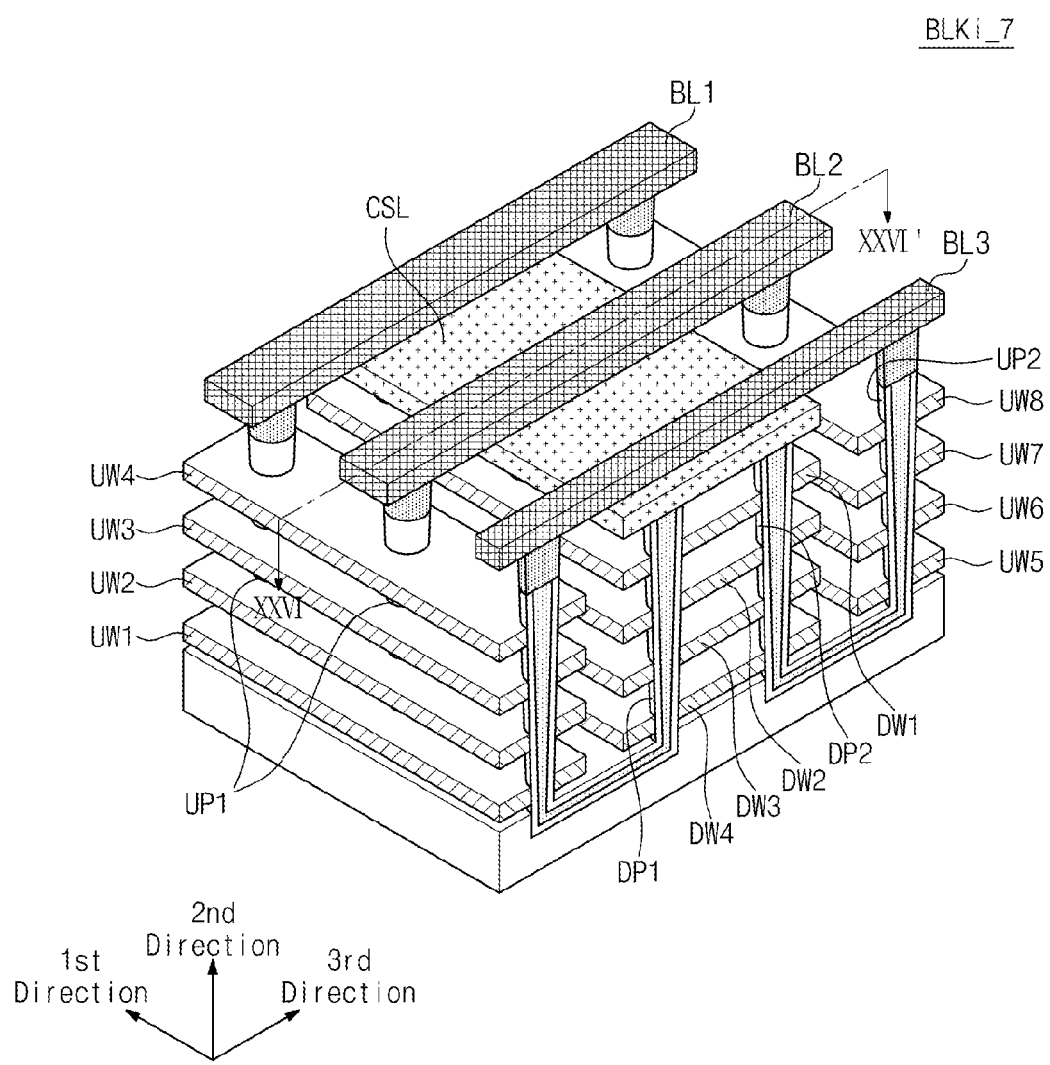
Figure 26:
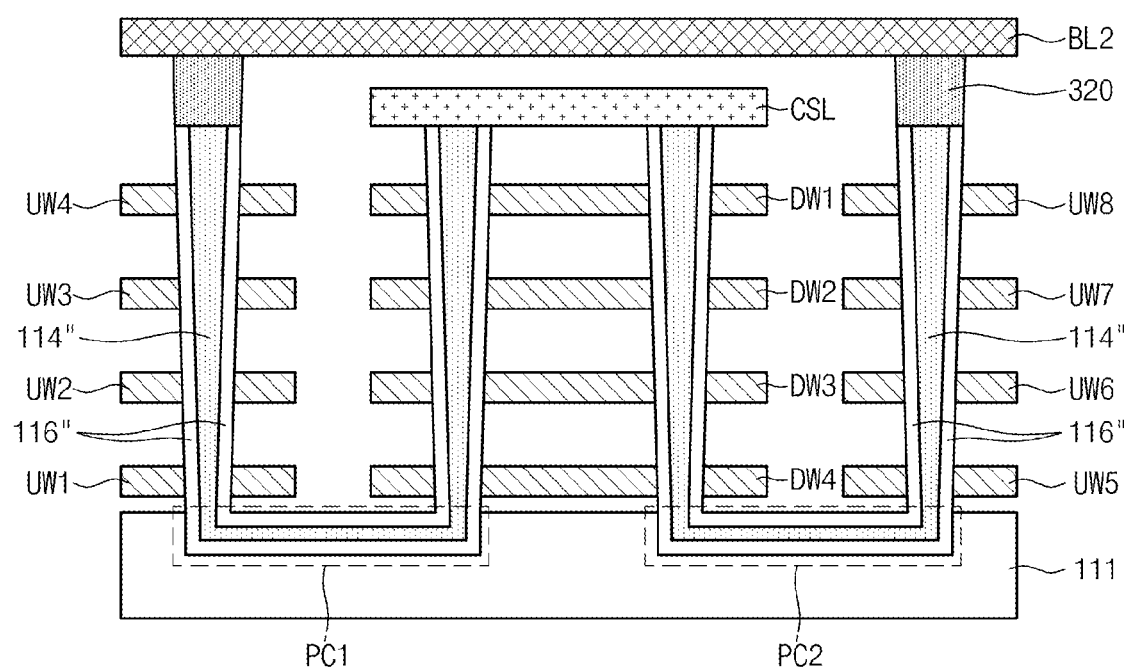

FIG. 25 is a perspective view illustrating a structure of a memory block BLKi_7 corresponding to the memory block of FIG. 3 according to example embodiments of the inventive concepts. FIG. 26 is a cross-sectional view taken along the line XXVI-XXVI' of the memory block BLKi_7 of FIG. 25. Referring to FIGS. 25 and 26, first to fourth upper word lines UW1-UW4 extending in a first direction may be sequentially provided over a substrate 111 in a second direction. The first to fourth upper word line UW1-UW4 may be provided at intervals in the second direction. First upper pillars UP1 may be at intervals in the second direction, and penetrate the first to fourth upper word lines UW1-UW4 along the second direction.

Second to fourth lower word lines DW2-DW4 extending in the first direction may be sequentially provided in the second direction over the substrate 111 spaced apart from the first to fourth upper word lines UW1-UW4 in the third direction. The second to fourth word lines DW2-DW4 may be at intervals in the second direction. A 1a-th lower word line DW1a and a 1b-th lower word line DW1b may be at intervals over the third lower word line DW3 in the second direction (not shown). The 1a-th and 1b-th lower word lines DW1a and DW1b may be at intervals in the third direction.

First lower pillars DP1 may be at intervals in the first direction and penetrate the 1a-th lower word line DW1a and the second to fourth lower word lines DW2-DW4. Second lower pillars DP2 may be at intervals in the first direction and penetrate the 1b-th lower word line DW1b and the second to fourth lower word lines DW2-DW4 in the second direction. For example, the first lower pillars DP1 and the second lower pillars DP2 may be disposed in parallel to each other in the second direction.

Fifth to eighth upper word lines UW5-UW8 extending in the first direction may be sequentially provided in the second direction over the substrate 111 spaced apart from the lower word lines DW1a, DW1b, and DW2-DW4 in the third direction. The fifth to eighth upper word lines UW5-UW8 may be at intervals in the second direction. Second upper pillars UP2 may be disposed in the first direction at intervals of a predetermined distance, and penetrate the fifth to eighth upper word lines UW5-UW8 in the second direction.

A common source line CSL extending in the first direction may be provided over the first and second lower pillars DP1 and DP2. For example, the common source line CSL may include an n-type silicon material. When the common source line is of conductive materials such as metal or polysilicon without polarity, n-type sources may be additionally provided between the common source line CSL and the first and second lower pillars DP1 and DP2. The common source line CSL and the first and second lower pillars DP1 and DP2 may be connected through contact plugs, respectively.

Drains 320 may be on the first and second pillars UP1 and UP2. For example, the drains 320 may include an n-type silicon material. A plurality of bit lines BL1-BL3 extending in the third direction may be sequentially provided over the drains 320 in the first direction. The bit lines BL1-BL3 may be formed of, for example, metal. The bit lines BL1-BL3 and the drains 320 may be connected through, for example, contact plugs.

The first and second upper pillars UP1 and UP2 may include a surface layer 116" and an internal layer 114", respectively. The first and second lower pillars DP1 and DP2 may include a surface layer 116" and an internal layer 114", respectively. The surface layer 116" may be configured to store data similarly to the insulation layer 116 described with reference to FIG. 5. For example, the surface layer 116" of the first and second upper pillars UP1 and UP2, and the first and second lower pillars DP1 and DP2 may include a blocking insulation layer, a charge storage layer and a tunneling insulation layer.

The tunneling insulation layer may include, for example, a thermal oxide layer. The charge storage layer 118 may include, for example, a nitride layer and/or a metal oxide layer (e.g., aluminum oxide layer and/or hafnium oxide layer). The blocking insulation layer 119 may be a mono- or multi-layer. The blocking insulation layer 119 may be a high dielectric layer (e.g., aluminum oxide layer and/or hafnium oxide layer) of a higher dielectric constant than dielectric constants of the tunneling insulation layer and the charge storage layer. For example, the tunneling insulation layer, the change storage layer and the blocking insulation layer may constitute Oxide-Nitride-Oxide ONO.

The internal layer 114" of the first and second upper pillars UP1 and UP2, and the first and second lower pillars DP1 and DP2 may include a p-type silicon material. The internal layer 114" of the first and second upper pillars UP1 and UP2, and the first and second lower pillars DP1 and DP2 may serve as a second-direction body. The first upper pillars UP1 and the first lower pillars DP1 may be connected through first pipeline contacts PC1. For example, the surface layers 116" of the first upper pillars UP1 and the first lower pillars DP1 may be connected through the surface layers of the first pipeline contacts PC1.

The surface layers of the first pipeline contacts PC1 may be of the same materials as the surface layers 116" of the first upper pillars UP1 and the first lower pillars DP1. For example, the internal layers 114" of the first upper pillars UP1 and the first lower pillars DP1 may be connected through the internal layers of the first pipeline contacts PC1. The internal layers of the first pipeline contacts PC1 may be of the same materials as the internal layers 114" of the first upper pillars UP1 and the first lower pillars DP1.

The first upper pillars UP1 and the first and fourth upper word lines UW1-UW4 may form first upper strings, and the first lower pillars DP1, the 1a-th lower word line DW1a, and the second to fourth lower word lines DW2-DW4 may form first lower strings. The first upper strings and the first lower strings may be connected through the first pipeline contacts PC1, respectively. The drains 320 and the bit lines BL1-BL3 may be connected to one end of the first upper strings. The common source line CSL may be connected to one end of the first lower strings. The first upper strings and the first lower strings may form a plurality of strings connected between the bit lines BL1-BL3 and the common source line CSL.

The second upper pillars UP2 and the fifth to eighth upper word lines UW5-UW8 may form second upper strings, and the second lower pillars DP2, the 1b-th lower word line DW1b, and the second to fourth word lines DW2-DW4 may form second lower strings. The second upper strings and the second lower strings may be connected through second pipeline contacts PC2. The drains 320 and the bit lines BL1-BL3 may be connected to one end of the second upper strings. The common source line CSL may be connected to one end of the second lower strings. The second upper strings and the second lower strings may form a plurality of strings connected between the bit lines BL1-BL3 and the common source line CSL.

Eight transistors may be provided in one string. Except that two strings are connected to the first to third bit lines BL1-BL3, respectively, an equivalent circuit of the memory block BLKi_7 may be shown as in FIG. 3, but embodiments are not limited to the number of the word lines, the bit lines, and the strings of the memory block BLKi_7.

For example, in order to form a channel in the internal layer serving as a body in the first and second pipeline contacts PC1 and PC2, first and second pipeline contact gates (not shown) may be provided respectively. The first and second pipeline contact gates (not shown) may be provided on the surface of the first and second pipeline contacts PC1 and PC2.

For convenience of explanation, the conductive lines UW1-UW8, DW1a, DW1b, and DW2-DW4 extending in the first direction have been described as word lines. However, the upper word lines UW4 and UW8 adjacent to the bit lines BL1-BL3 may be used as string select lines SSL. The lower word lines DW1a and DW1b adjacent to the common source line CSL may be used as ground select lines GSL.

For example, the lower word lines DW2-DW4 have been described as being shared in adjacent lower pillars DP1 and DP2. However, when the upper pillars adjacent to the upper pillar UP1 or UP2 are added, the adjacent upper pillars may be configured to share the upper word lines UW2-UW4 or UW5-UW7. For example, it will be assumed that the fourth upper word lines UW4 and the eighth upper word lines UW8 are used as string select lines SSL, respectively. It will be assumed that the first lower word line DW1 is used as a ground select line GSL. Also, it will be assumed that the first to third upper word lines UW1-UW3, the fifth to seventh upper word lines UW5-UW7, and the second to fourth lower word lines DW2-DW4 are used as word lines WL, respectively.

As illustrated in FIGS. 25 and 26, the width of the pillar may vary with a distance on the channel between the string select line SSL and the word line WL. For example, as the distance on the channel between the string select line SSL and the word line WL increases, the width of the pillar may decrease. In the lower pillars DP1 and DP2, as the distance on the channel between the string select line SSL and the word line WL increases, the width of the pillar may increase. In order to compensate for a difference of the tunneling effect (or variation of the threshold voltage) according to the variation of the width of the pillar, the levels of the word line voltages may be adjusted.

Figure 27:
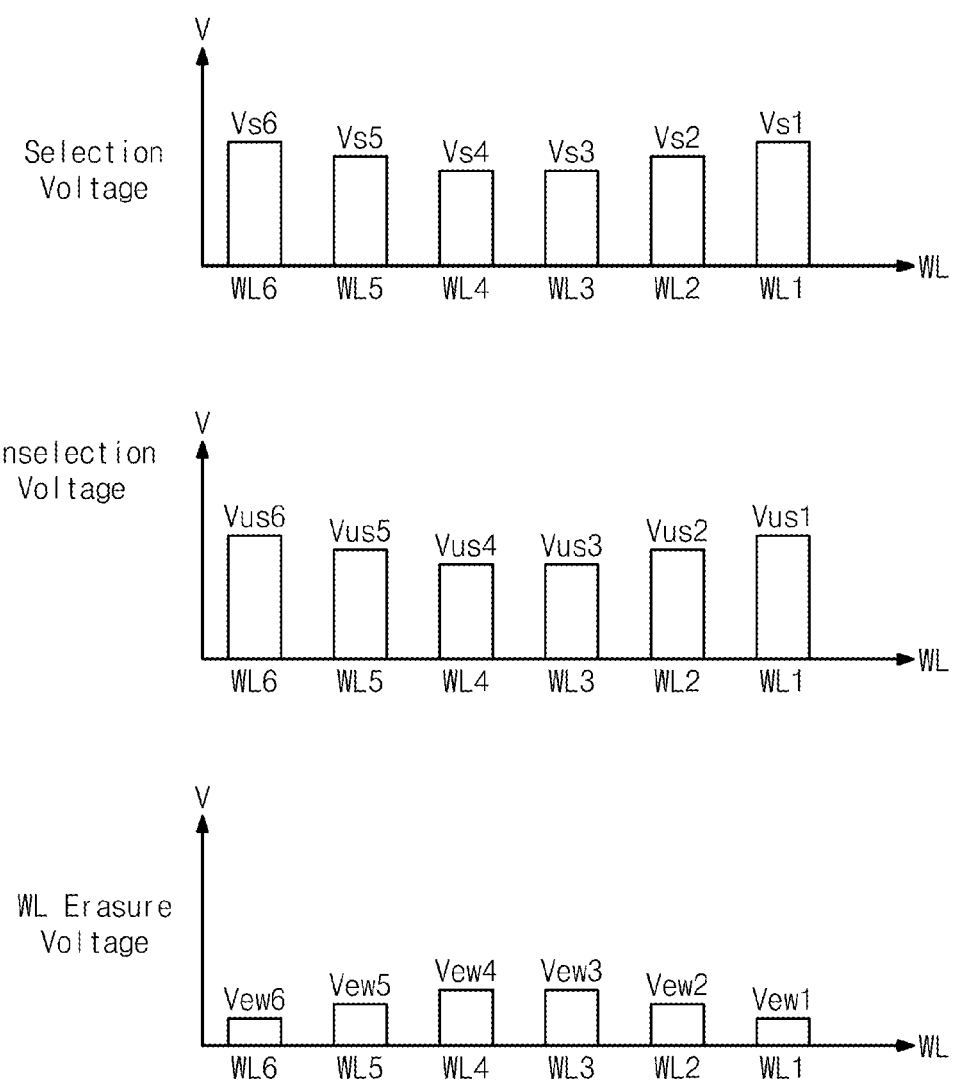

FIG. 27 includes 3 graphs illustrating exemplary word line voltage levels provided to the memory block BLKi_7 of FIGS. 25 and 26. In FIG. 27, the horizontal axis represents word lines WL, and the vertical axis represents voltage V. Referring to FIGS. 25-27, as a distance between the string select line SSL and the word line WL increases, the levels of the select voltage Vs and the unselect voltage Vus may decrease and then increase (e.g., sequentially). As the width of a pillar decreases, the levels of the select voltage Vs and the unselect voltage Vus may decrease. As the width of a pillar increases, the levels of the select voltage Vs and the unselect voltage Vus may increase.

As the distance on a channel between the string select line SSL and the word line WL increases, the level of the word line erase voltage Vew may increase and then decrease (e.g., sequentially). As the width of the pillar decreases, the level of the word line erase voltage Vew may increase. As the width of the pillar increases, the level of the word line voltage Vew may decrease. When the levels of the word line voltages are adjusted according to the distance on the channel between the string select line SSL and the word line WL, the reliability of the nonvolatile memory device 100 may be improved.

For example, the first to sixth word line erase voltages Vew1-Vew6 may have higher levels than a ground voltage Vss. The first to seventh word line erase voltages Vew1-Vew6 may have lower levels than the ground voltage Vss. A portion of the first to seventh word line erase voltages Vew1-Vew7 may have higher levels than the ground voltage Vss, and a different portion of the first to seventh word line erase voltages Vew1-Vew7 may have lower levels than the ground voltage Vss. One of the first to seventh word line erase voltages Vew1-Vew7 may be the ground voltage Vss. For example, the word lines WL may be divided into a plurality of groups and the levels of the word line voltages may be adjusted by unit of groups of the divided word lines.

Figure 28:
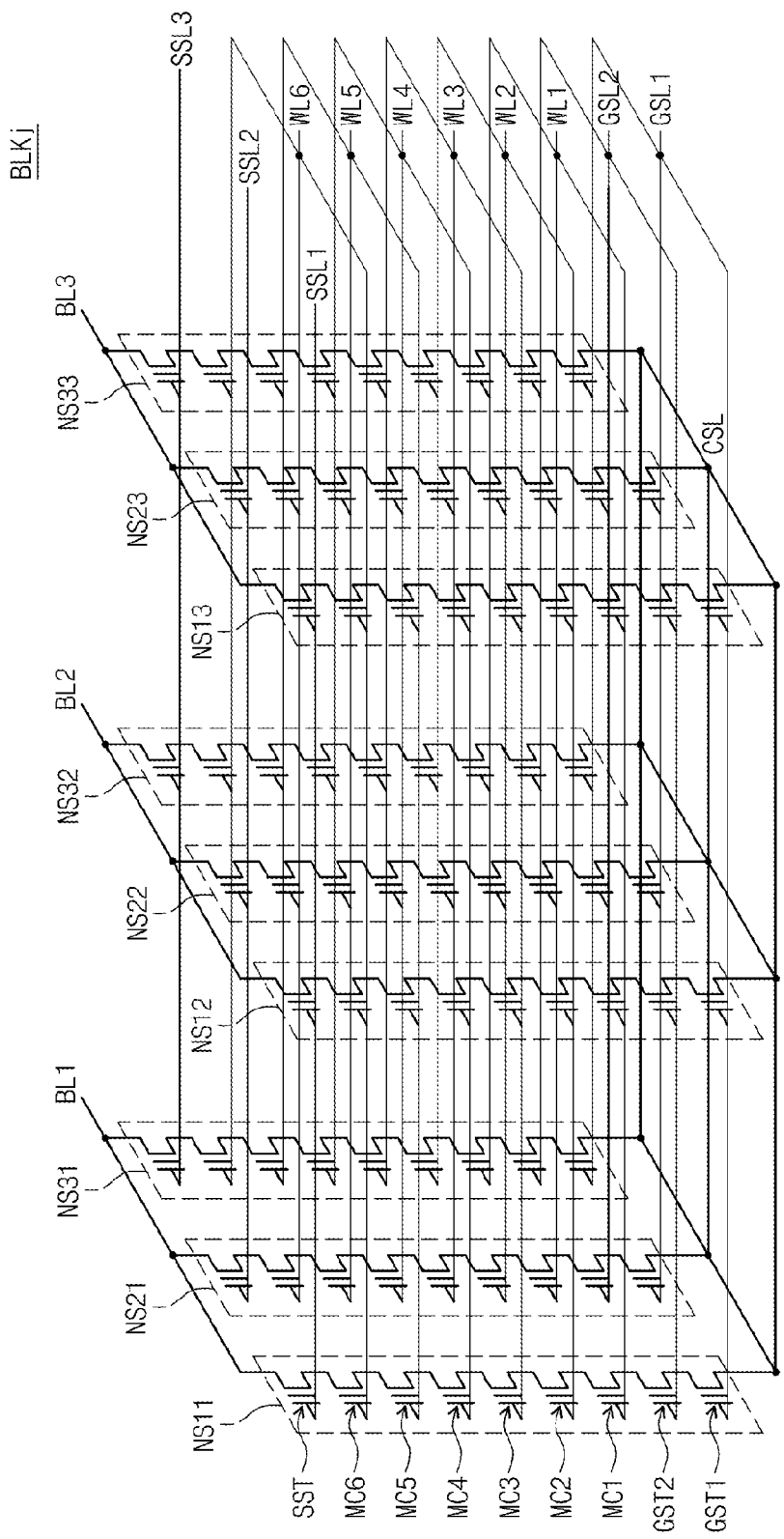

FIG. 28 is a circuit diagram illustrating a memory block BLKj among the memory blocks BLK1-BLKz of FIG. 2 according to example embodiments of the inventive concepts. Compared to the memory block BLKi described in FIG. 3, in each NAND string NS, two ground select transistors GST1 and GST2 may be between memory cells MC1-MC6 and a common source line CSL. Ground select lines GSL1 and GSL2 corresponding to the ground select transistors GST1 and GST2 of the same height may be connected in common. The ground select lines GSL1 and GSL2 corresponding to the same NAND string NS may be connected in common. The structure of the memory block BLKj may be configured as described with reference to FIGS. 4-24. In the memory block BLKj, the level of the word line voltage may be adjusted according to a distance between the string select line SSL and the word line WL.

Figure 29:
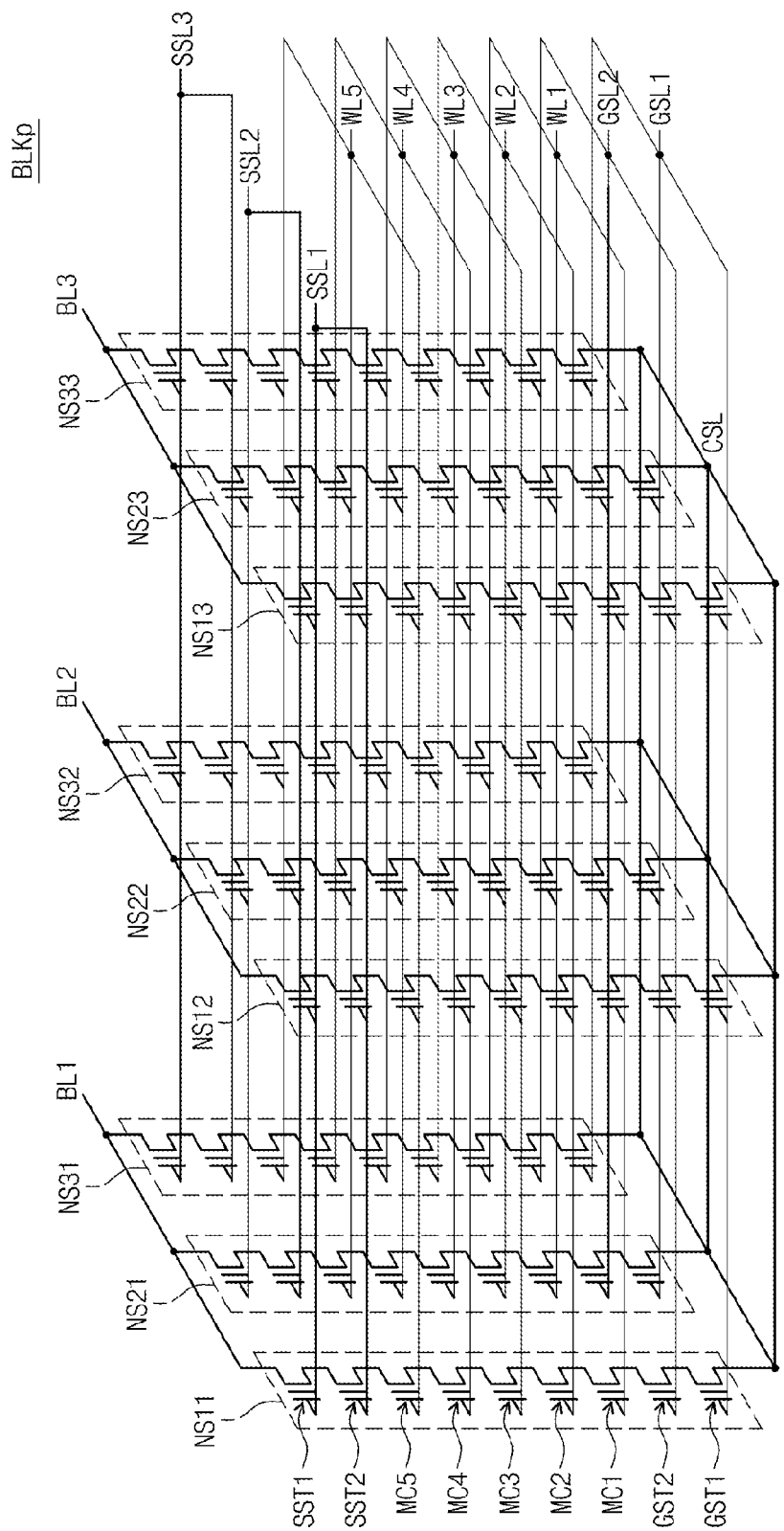

FIG. 29 is a circuit diagram illustrating a memory block BLKp among the memory blocks BLK1-BLKz of FIG. 2 according to example embodiments of the inventive concepts. Compared to the memory block BLKj of FIG. 28, in each NAND string NS, two string select transistors SST1 and SST2 may be provided between memory cells MC1-MC5 and a bit line BL. The string select lines SSL corresponding to the same NAND string NS may be connected in common, and may be electrically separated from each other. The structure of the memory block BLKp may be configured as described with reference to FIGS. 4-24. In the memory block BLKp, the level of the word line voltage may be adjusted according to a distance between the string select line SSL and the word line WL.

As described with reference to FIGS. 3, 28, and 29, at least one string select transistor SST and at least one ground select transistor GST may be provided in each NAND string NS. As described with reference to FIGS. 4-27, the select transistors SST or GST, and memory cells may have the same structure. The number of the string select transistor SST and the number of the ground select transistor GST may vary while maintaining the structure described with reference to FIGS. 4-27.

Figure 30:
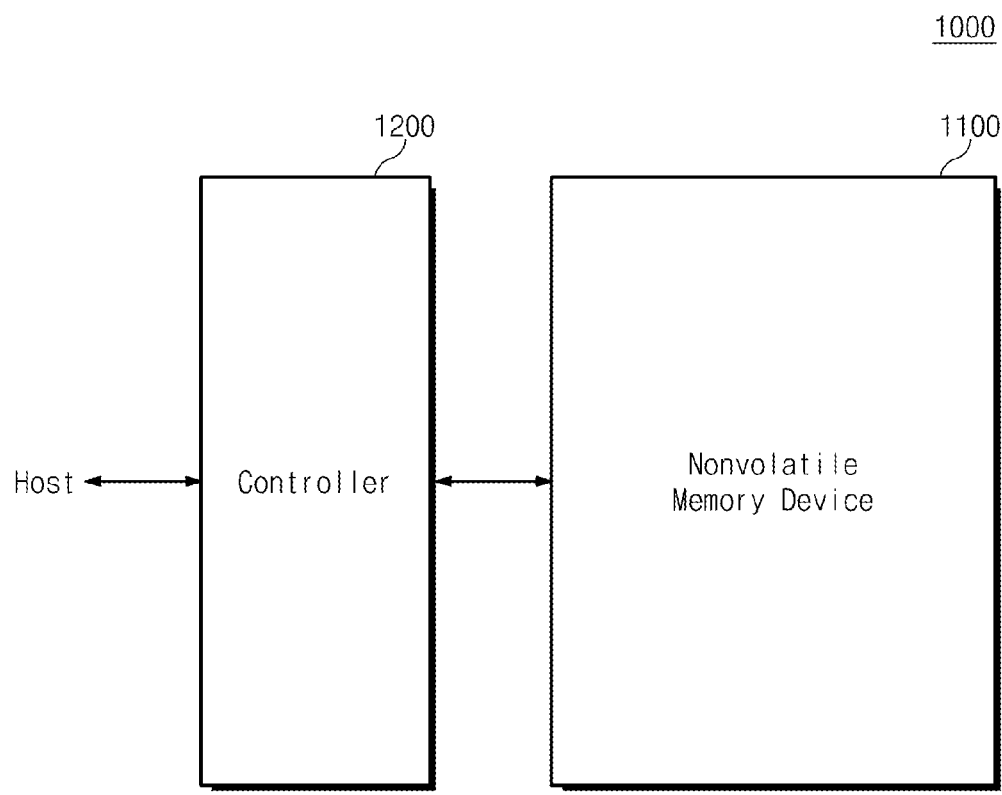

FIG. 30 is a block diagram illustrating a memory system 1000 including the nonvolatile memory device 100 of FIG. 1. Referring to FIG. 30, the memory system 1000 may include a nonvolatile memory device 1100 and a controller 1200. The nonvolatile memory device 1100 may be configured and operate according to example embodiments of the inventive concepts, for example, as described with respect to FIGS. 1-29.

The controller 1200 may be connected to a host and the nonvolatile memory device 1100. In response to a request from the host, the controller 1200 may be configured to access the nonvolatile memory device 1100. For example, the controller 1200 may be configured to control read, write, erase, and background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

For example, as described with reference to FIG. 1, the controller 1200 may be configured to provide a control signal CTRL and an address ADDR to the nonvolatile memory device 100. The controller 1200 may be configured to exchange data with the nonvolatile memory device 100. For example, the controller 1200 may further include well-known components such as a Random Access Memory (RAM), a processing unit, a host interface, and a memory interface (not shown). The RAM may be used as one of an operating memory of a processing unit, a cache memory between the nonvolatile memory device 1100 and the host, and a buffer memory between the nonvolatile memory device 1100 and the host. The processing unit may control overall operations of the controller 1200.

The host interface may include a protocol for performing data exchange between the host and the controller 1200. The controller 1200 may be configured to communicate with an external device (host) through at least one of various interface protocols. For example, Universal Serial Bus (USB) protocols, Multimedia Card (MMC) protocols, Peripheral Component Interconnection (PCI) protocols, PCI-Express (PCI-E) protocols, Advanced Technology Attachment (ATA) protocols, serial-ATA protocols, parallel-ATA protocols, Small Computer Small Interface (SCSI) protocols, Enhanced Small Disk Interface (ESDI) protocols, and/or Integrated Drive Electronics (IDE) protocols). The memory interface may interface with the nonvolatile memory device 1100. For example, the memory interface may include a NAND and/or NOR interface.

The memory system 1000 may be configured to include an error correction block (not shown). The error correction block may be configured to detect and correct an error of data read from the nonvolatile memory device 1100 using an error correction code ECC. For example, the error correction block may be provided as a component of the controller 1200. The error correction block may be provided as a component of the nonvolatile memory device 1100.

The controller 1200 and the nonvolatile memory device 1100 may be integrated into one semiconductor device. For example, the controller 1200 and the nonvolatile memory device 1100 may be integrated into one semiconductor device as a memory card. The controller 1200 and the nonvolatile memory device 1100 may be integrated into one semiconductor device as, for example, PC cards (Personal Computer Memory Card International Association (PCMCIA)), Compact Flash (CF) cards, Smart Media (SM and SMC) cards, memory sticks, Multimedia cards (MMC, RS-MMC, and MMCmicro), SD cards (SD, miniSD, microSD, and SDHC), and/or Universal Flash Storages (UFS).

The controller 1200 and the nonvolatile memory device 1100 may be integrated into one semiconductor device to form semiconductor drives (Solid State Drive (SSD)). A semiconductor drive (SSD) may include storage devices configured to store data in semiconductor memories. When the memory system 1000 is used as a semiconductor drive (SSD), the operation speed of the host connected to the memory system 1000 may be improved.

The memory system 1000 may be provided as one of various components of electronic devices. For example, the memory system 1000 may be provided as one of various components of Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game consoles, navigation devices, black boxes, digital cameras, digital audio recorders, digital audio players, digital picture recorders, digital picture players, digital video recorders, digital video players, devices capable of sending/receiving information under wireless environments, one of various electronic devices constituting home networks, one of various electronic devices constituting computer networks, one of various electronic devices constituting telematics networks, RFID devices, and/or one of various components constituting computing systems.

For example, the nonvolatile memory device 1100 or the memory system 1000 may be mounted in various types of packages. The nonvolatile memory device 1100 or the memory system 1000 may be packaged using various methods. For example, the nonvolatile memory device 1100 or the memory system 1000 may be packaged using Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

Figure 31:
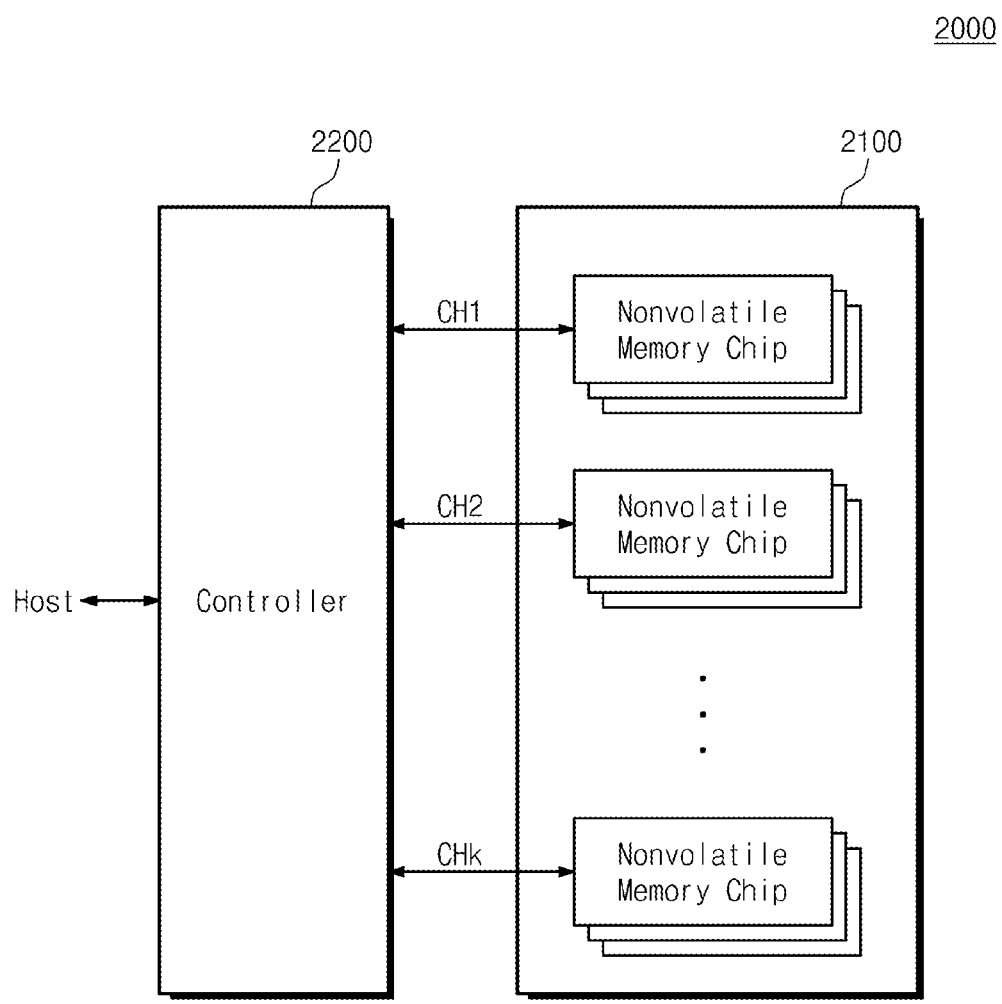

FIG. 31 is a block diagram illustrating an application example of the memory system 1000 of FIG. 30. Referring to FIG. 31, a memory system 2000 may include a nonvolatile memory device 2100 and a controller 2200. The nonvolatile memory device 2100 may include a plurality of nonvolatile memory chips. The plurality of nonvolatile memory chips may be divided into a plurality of groups. Each group of the plurality of nonvolatile memory chips may be configured to communicate with the controller 2200 through one common channel.

In FIG. 31, the plurality of nonvolatile memory chips are illustrated as communicating with the controller 2200 through first to k-th channels CH1-CHk. Each nonvolatile memory chip may be configured similarly to the nonvolatile memory device 100 described with reference to FIGS. 1-29. In FIG. 31, the plurality of nonvolatile memory chips are illustrated as being connected to one channel. However, the memory system 2000 may be modified such that one nonvolatile memory chip may be connected to one channel.

Figure 32:
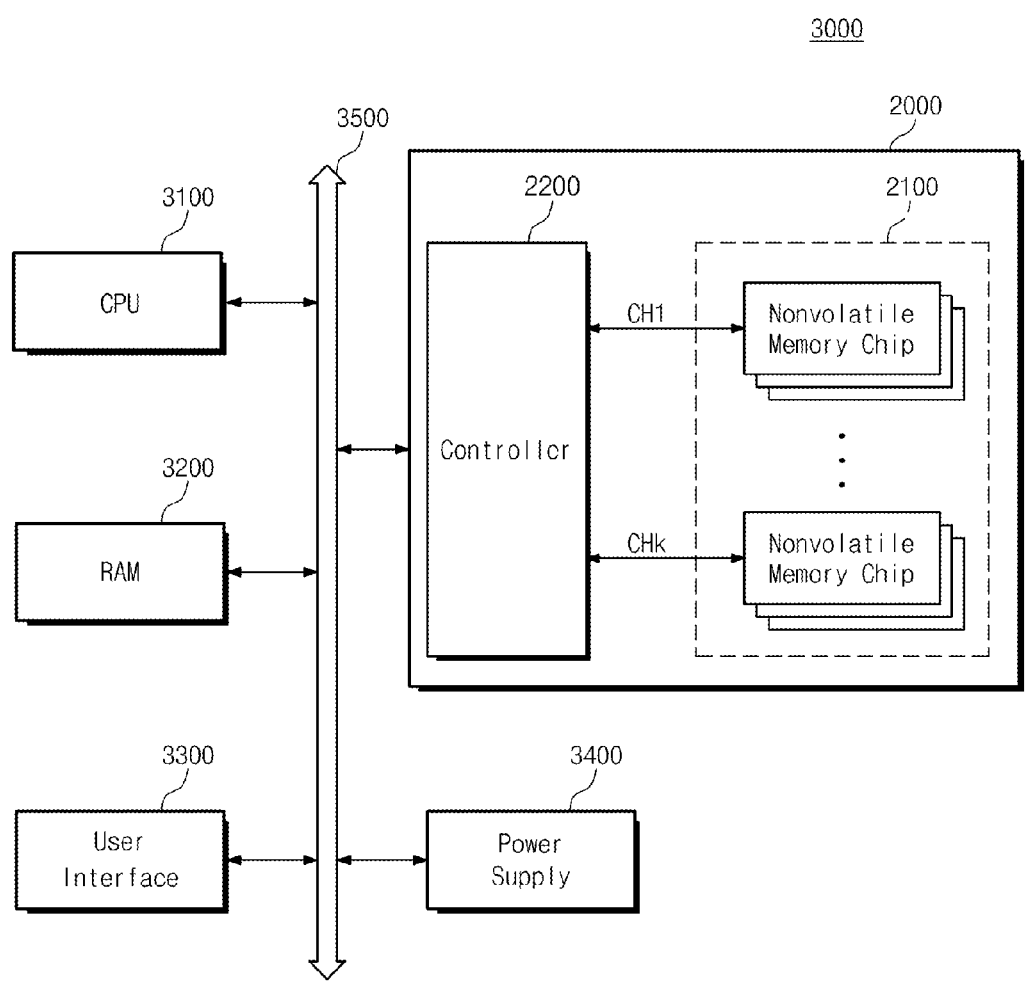

FIG. 32 is a block diagram illustrating a computing system 3000 including the memory system 2000 described with reference to FIG. 31. Referring to FIG. 32, the computing system 3000 may include a central processing unit (CPU) 3100, a RAM 3200, a user interface 3300, a power supply 3400 and a memory system 2000. The memory system 2000 may be electrically connected to the CPU 3100, the RAM 3200, the user interface 3300, and the power supply 3400. Data provided through the user interface 3300 and/or processed by CPU 3100 may be stored in the memory system 2000.

In FIG. 32, the nonvolatile memory device 2100 is illustrated as being connected to a system bus 3500 through the controller 2200. However, the nonvolatile memory device 2100 may be configured to be directly connected to the system bus 3500. In FIG. 32, the memory system 2000 described with reference to FIG. 31 is illustrated. However, the memory system 2000 may be substituted with or in addition to, for example, the memory system 1000 described with reference to FIG. 30. For example, the computing system 3000 may be configured to include all of the memory systems 1000 and 2000 described with reference to FIGS. 30 and 31.

According to example embodiments of the inventive concepts, a level of a word line voltage may be adjusted according to a location of a word line. Accordingly, since the tunneling effect at the location of word line is equalized and/or improved, the reliability of a nonvolatile memory device may be improved.

Figure 33:
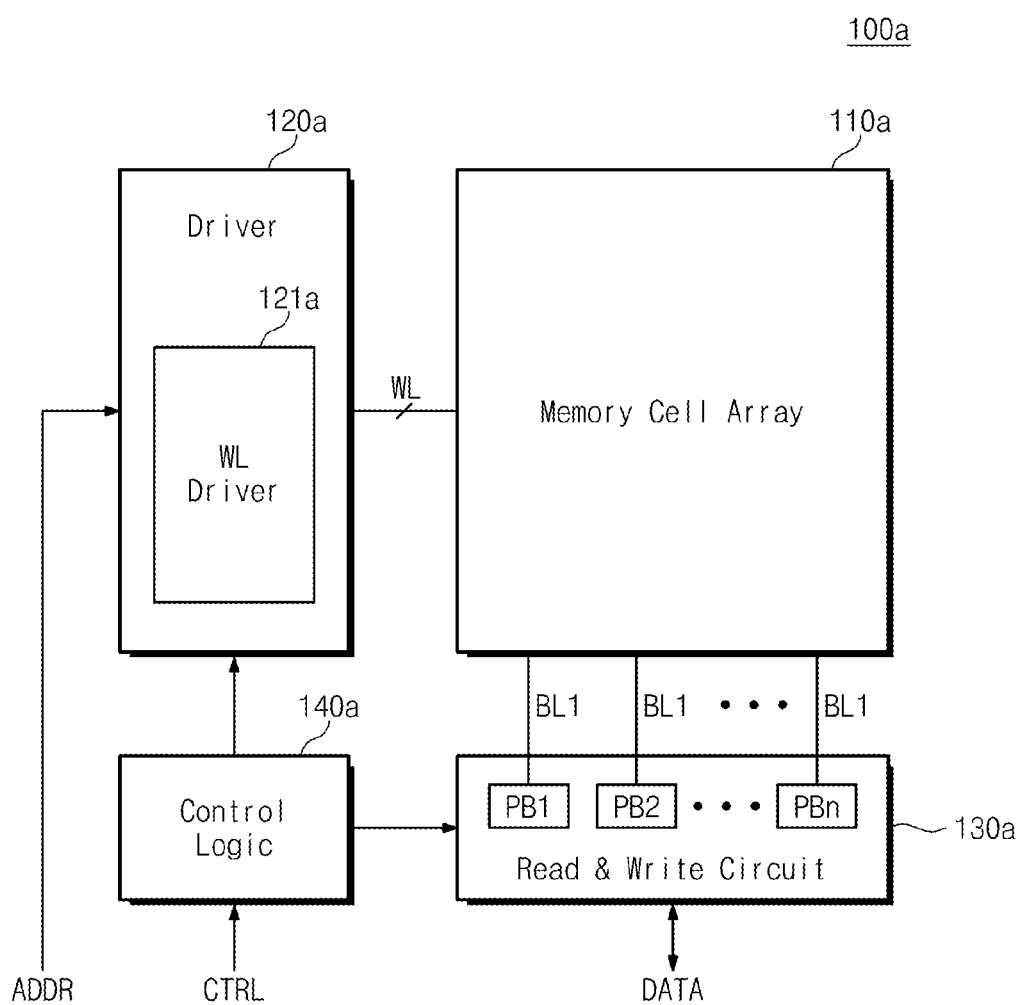
FIG. 33 is a block diagram schematically illustrating a nonvolatile memory device according to example embodiments of the inventive concepts.

FIG. 33 is a block diagram schematically illustrating a nonvolatile memory device according to example embodiments of the inventive concepts. Compared with a nonvolatile memory device 100 in FIG. 1, a read/write circuit 130a may further include a plurality of page buffers PB1 to PBn, which are connected with a plurality of bit lines BL1 to BLn, respectively. The page buffers PB1 to PBn may be configured to supply specific bias voltages to the bit lines BL1 to BLn and to detect voltages of the bit lines BL1 to BLn.

Control logic 140a may control levels or applying times of bias voltages applied to the bit lines BL1 to BLn from the page buffers PB1 to PBn. For example, the control logic 140a may adjust levels or applying times of the bias voltages according to a location of a selected word line.

The memory cell array 110a, driver 120a, and WL driver 121a in FIG. 33 may be the same as the memory cell array 110, driver 120, and WL driver 121 described previously with respect to FIG. 1. Although not shown in FIG. 33, the driver 120a may include a select line driver that is the same as the select line driver 123 described previously with respect to FIG. 1.

Figure 34:
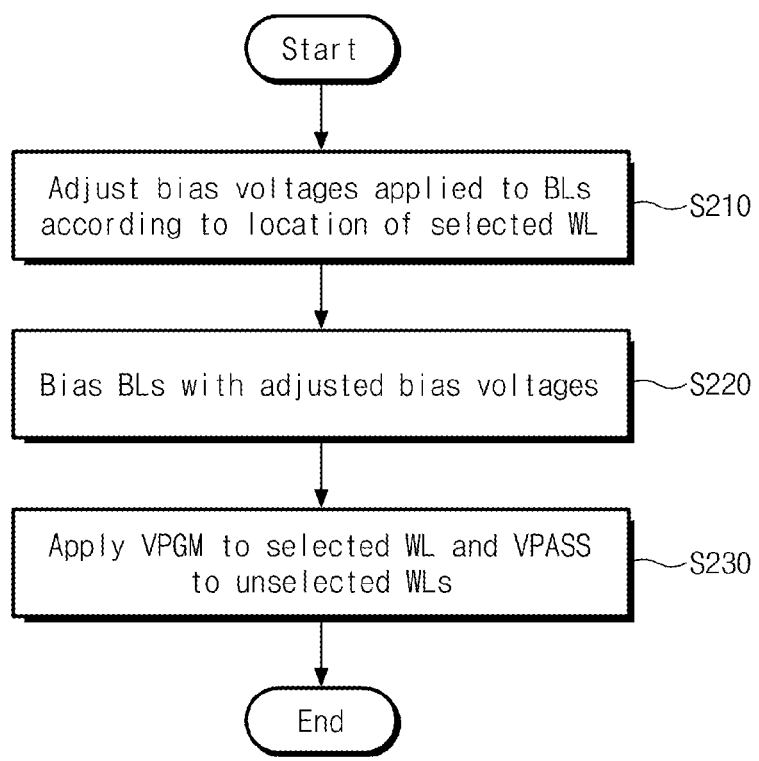
FIG. 34 is a flowchart illustrating an operating method of a nonvolatile memory device in FIG. 33 according to example embodiments of the inventive concepts.

FIG. 34 is a flowchart illustrating an operating method of a nonvolatile memory device in FIG. 33 according to example embodiments of the inventive concepts. Referring to FIGS. 33 and 34, in operation S210, bias voltages applied to bit lines may be adjusted according to a location of a selected word line. For example, bias voltages applied to bit lines may be adjusted according to a distance between a selected word line and a substrate 111 (refer to FIGS. 4 and 5). Bias voltages applied to bit lines may be adjusted according to how a selected word line is spaced apart from the substrate 111. Levels or applying times of the bias voltages applied to bit lines may be adjusted.

In operation S220, the adjusted bias voltages may be applied to the bit lines BL1 to BLn. In operation S230, a program voltage VPGM may be applied to the selected word line, and a pass voltage VPASS may be applied to unselected word lines.

Figures 35, 36:
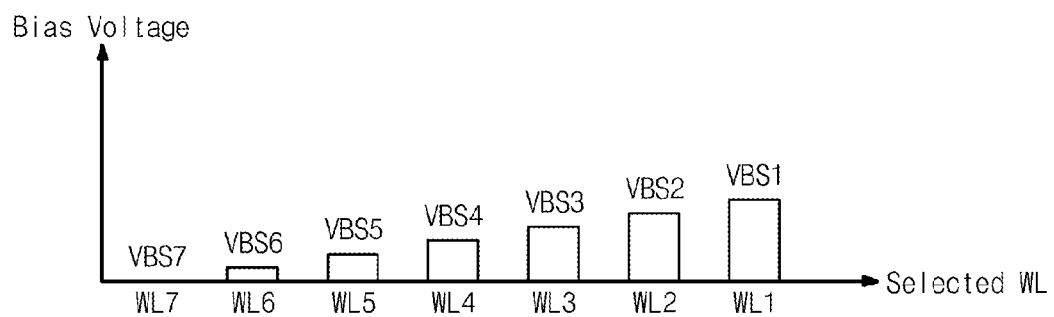
FIG. 35 is a table illustrating an example of bias voltages adjusted according to a selected word line.
FIG. 36 is a diagram illustrating an example that bias voltages applied to bit lines are adjusted according to a selected word line.

FIG. 35 is a table illustrating an example of bias voltages adjusted according to a selected word line. When one of word lines WL1 to WL7 is selected, bias voltages may be adjusted by one of bias voltages VBS1 to VBS7 corresponding to the selected word line.

FIG. 36 is a diagram illustrating an example that bias voltages applied to bit lines are adjusted according to a selected word line. In FIG. 36, a horizontal axis may indicate a location of a selected word line, and a vertical axis may indicate an applying time or level of a bias voltage. In example embodiments, when a nonvolatile memory device 100a has a structure illustrated in FIGS. 4, 5, 17, 18, 21, and 22, bias voltages may be adjusted as illustrated in FIG. 36. In FIG. 36, WL1 corresponds to a word line that is closer to the substrate 111 than WL2 to WL6, and WL7 corresponds to a word line that is farther from the substrate 111 than WL1 to WL6.

As a distance between a selected word line and a substrate 111 increases, a level of a bias voltage may sequentially decrease. As a distance between a selected word line and a substrate 111 increases, widths of pillars 113 may increase. This may force a program speed to be lowered. When a level of a bias voltage of a bit line connected with a memory cell to be programmed is reduced, a voltage difference between channels of memory cells and word lines may increase, and a program speed may increase. That is, if a bias voltage level is lowered according to an increase in a distance between a selected word line and a substrate 111, a program speed difference due to a difference of widths of the pillars 113 may be compensated. It is possible to improve a threshold voltage distribution of memory cells and the reliability of the nonvolatile memory device 100a.

Likewise, a level of a bias voltage of a bit line connected with a memory cell to be program inhibited may also decrease according to an increase in a distance between a selected word line and a substrate 111. As widths of the pillars 113 become narrow, program disturbance may also increase. If a bias voltage level is lowered according to an increase in a distance between a selected word line and a substrate 111, that is, if a bias voltage level increases according to a decrease in widths of the pillars 113, the program disturbance may be compensated. In example embodiments, an applying time of a bias voltage can become longer according to an increase in a bias voltage level.

Figure 37:
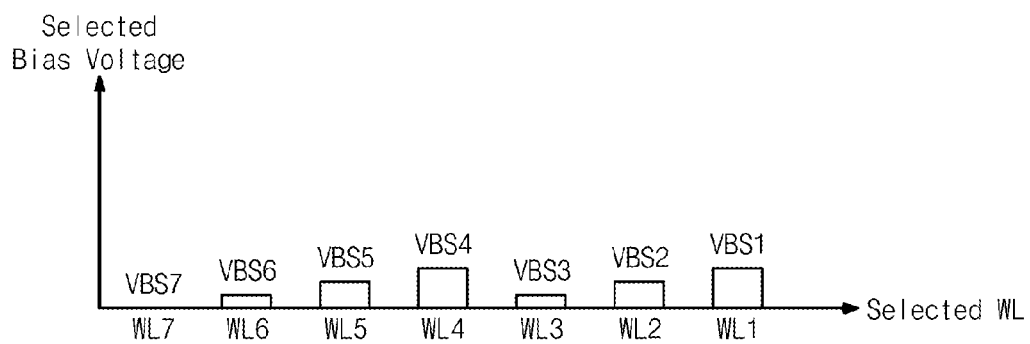
FIG. 37 is a diagram illustrating another example that bias voltages applied to bit lines are adjusted according to a selected word line.

FIG. 37 is a diagram illustrating another example that bias voltages applied to bit lines are adjusted according to a selected word line. In FIG. 37, a horizontal axis may indicate a location of a selected word line, and a vertical axis may indicate an applying time or level of a bias voltage. In example embodiments, when a nonvolatile memory device 100a has a structure illustrated in FIGS. 14, 15, 19, 20, 23, and 24, bias voltages may be adjusted as illustrated in FIG. 37. In FIG. 37, WL1 corresponds to a word line that is closer to the substrate 111 than WL2 to WL6, and WL7 corresponds to a word line that is farther from the substrate 111 than WL1 to WL6. As a distance between a selected word line and a substrate 111 increases, a level of a bias voltage may sequentially decrease, increase, and decrease.

Figure 38:
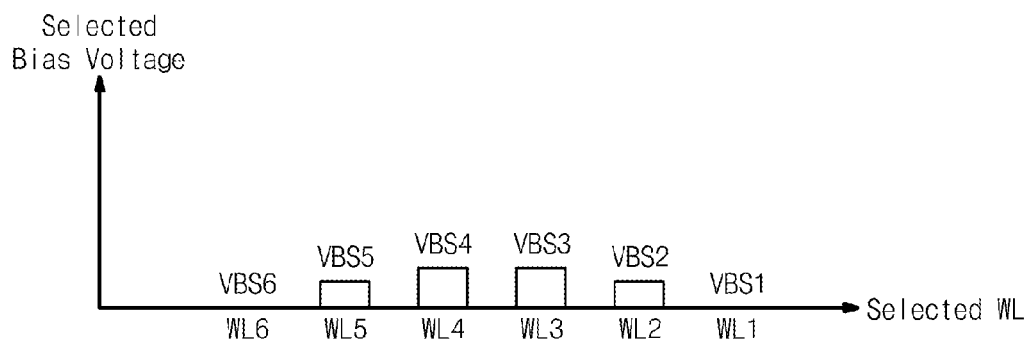
FIG. 38 is a diagram illustrating examples of bias voltages applied to bit lines are adjusted according to a selected word line.

FIG. 38 is a diagram illustrating example bias voltages applied to bit lines are adjusted according to a selected word line. In FIG. 38, a horizontal axis may indicate a location of a selected word line, and a vertical axis may indicate an applying time or level of a bias voltage. In example embodiments, when a nonvolatile memory device 100a has a structure illustrated in FIGS. 25 and 26, bias voltages may be adjusted as illustrated in FIG. 38. As a distance between a selected word line and a substrate 111 increases, a level of a bias voltage may sequentially increase and decrease.

Figure 39:
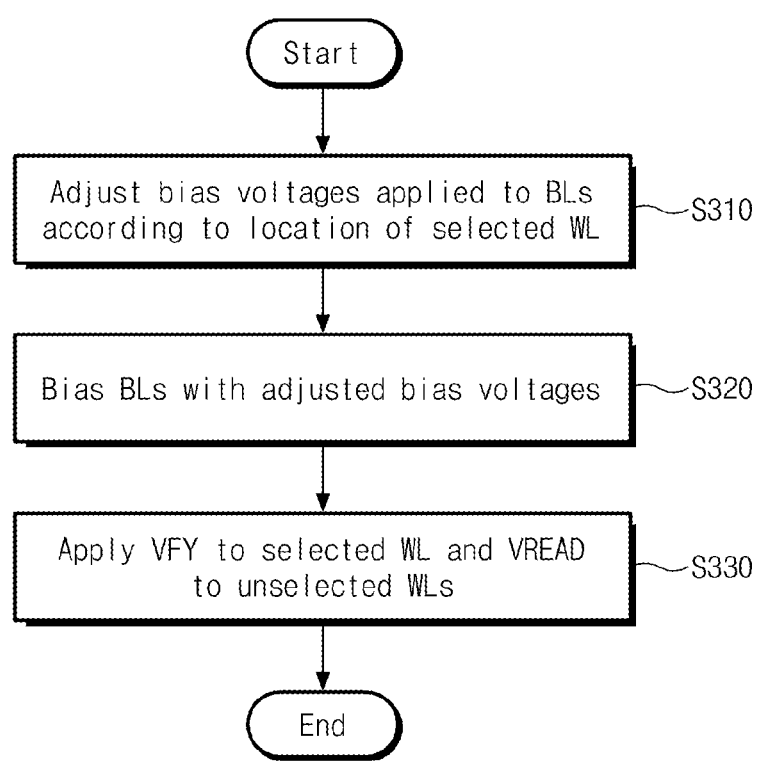
FIG. 39 is a flowchart illustrating an operating method of a nonvolatile memory device in FIG. 33 according to example embodiments of the inventive concepts.

FIG. 39 is a flowchart illustrating an operating method of a nonvolatile memory device in FIG. 33 according to example embodiments of the inventive concepts. Referring to FIGS. 33 and 39, in operation S310, bias voltages applied to bit lines may be adjusted according to a location of a selected word line. For example, bias voltages applied to bit lines may be adjusted according to a distance between a selected word line and a substrate 111 (refer to FIGS. 4 and 5). Bias voltages applied to bit lines may be adjusted according to how a selected word line is spaced apart from the substrate 111. Levels or applying times of the bias voltages applied to bit lines may be adjusted.

In operation S320, the adjusted bias voltages may be applied to the bit lines BL1 to BLn. In operation S330, a verification voltage VFY may be applied to the selected word line, and a read voltage VREAD may be applied to unselected word lines.

Figure 40:
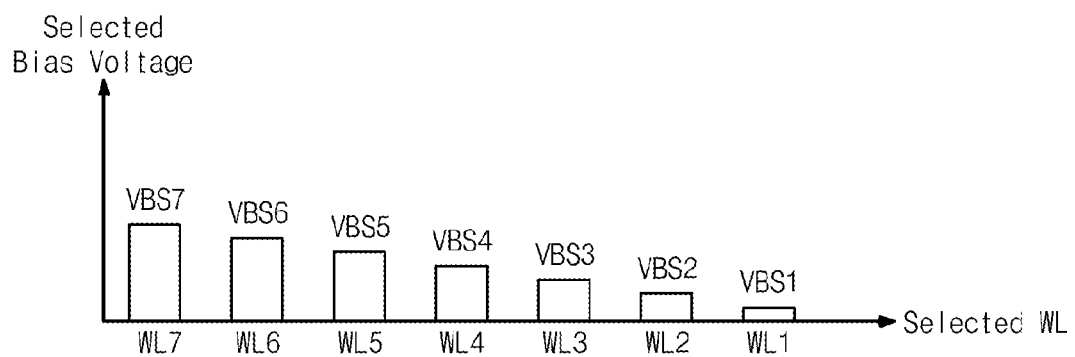
FIG. 40 is a diagram illustrating example bias voltages applied to bit lines are adjusted according to a selected word line.

FIG. 40 is a diagram illustrating example bias voltages applied to bit lines are adjusted according to a selected word line. In FIG. 40, a horizontal axis may indicate a location of a selected word line, and a vertical axis may indicate an applying time or level of a bias voltage. In example embodiments, when a nonvolatile memory device 100a has a structure illustrated in FIGS. 4, 5, 17, 18, 21, and 22, bias voltages may be adjusted as illustrated in FIG. 40. As a distance between a selected word line and a substrate 111 increases, a level of a bias voltage may sequentially decrease. In FIG. 40, WL1 corresponds to a word line that is closer to the substrate 111 than WL2 to WL6, and WL7 corresponds to a word line that is farther from the substrate 111 than WL1 to WL6.

As a distance between a selected word line and a substrate 111 increases, widths of pillars 113 may increase. This may force a program speed to be lowered. When a level of a bias voltage of a bit line increases at a program verification operation, threshold voltages of program-completed memory cells may increase. Memory cells corresponding to pillars of narrow widths may have high threshold voltages due to a fast program speed. Memory cells corresponding to pillars of wide widths may have high threshold voltages due to high levels of bias voltages. That is, if a bias voltage level increases according to an increase in a distance between a selected word line and a substrate 111, a difference between threshold voltages of memory cells due to a difference of widths of the pillars 113 may be reduced (and/or prevented), and the reliability of the nonvolatile memory device 100a may be improved.

In example embodiments, an applying time of a bias voltage can become longer according to an increase in a bias voltage level.

Figure 41:
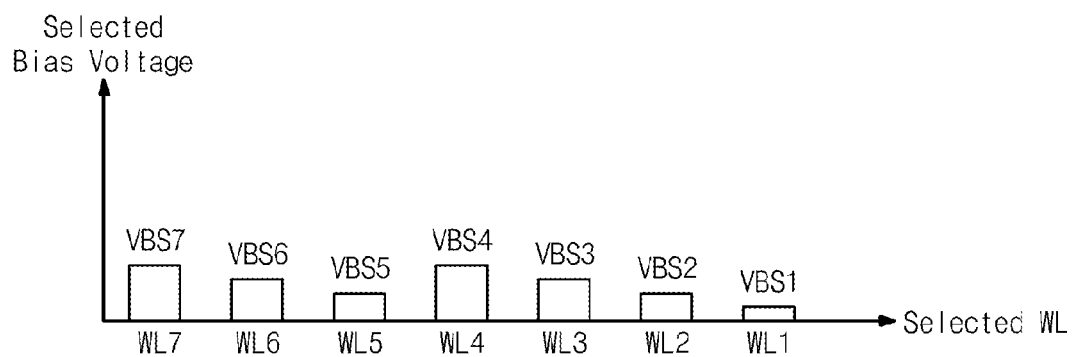
FIG. 41 is a diagram illustrating example bias voltages applied to bit lines are adjusted according to a selected word line.

FIG. 41 is a diagram illustrating example bias voltages applied to bit lines are adjusted according to a selected word line. In FIG. 41, a horizontal axis may indicate a location of a selected word line, and a vertical axis may indicate an applying time or level of a bias voltage. In example embodiments, when a nonvolatile memory device 100a has a structure illustrated in FIGS. 14, 15, 19, 20, 23, and 24, bias voltages may be adjusted as illustrated in FIG. 41. In FIG. 41, WL1 corresponds to a word line that is closer to the substrate 111 than WL2 to WL6, and WL7 corresponds to a word line that is farther from the substrate 111 than WL1 to WL6. As a distance between a selected word line and a substrate 111 increases, a bias voltage level may sequentially increase, decrease, and increase.

Figures 42, 43:
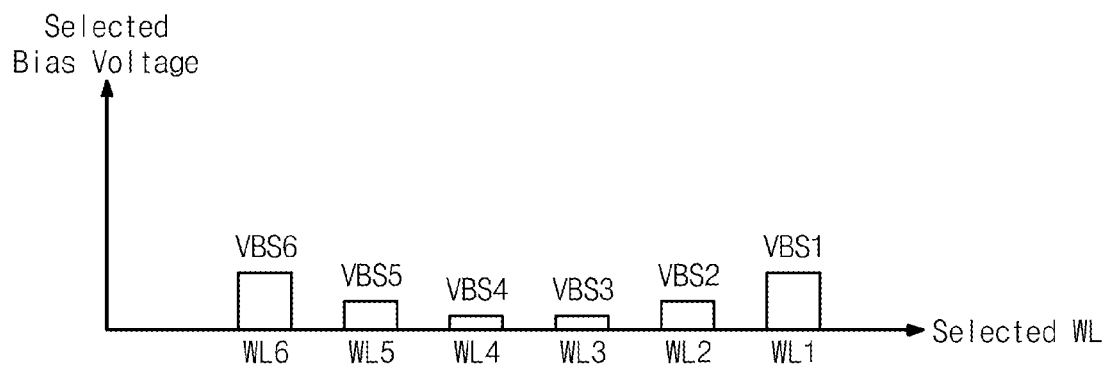
FIG. 42 is a diagram illustrating still example bias voltages applied to bit lines are adjusted according to a selected word line.
FIG. 43 is a table illustrating examples of bias voltages of bit lines adjusted according to a selected word line.

FIG. 42 is a diagram illustrating example bias voltages applied to bit lines are adjusted according to a selected word line. In FIG. 42, a horizontal axis may indicate a location of a selected word line, and a vertical axis may indicate an applying time or level of a bias voltage. In example embodiments, when a nonvolatile memory device 100a has a structure illustrated in FIGS. 25 and 26, bias voltages may be adjusted as illustrated in FIG. 38. As a distance between a selected word line and a substrate 111 increases, a bias voltage level may sequentially increase and decrease.

FIG. 43 is a table illustrating another example of bias voltages of bit lines adjusted according to a selected word line. Word lines WL1 to WL7 may be divided into a plurality of groups. When one of word line groups is selected, bias voltages may be adjusted by one of bias voltages VBS8 to VBS10 corresponding to the selected word line group.

While example embodiments have been particularly shown and described, it will be understood by one of ordinary skill in the art that variations in form and detail may be made therein without departing from the spirit and scope of the claims.

What is claimed is:

1. A nonvolatile memory device, comprising:
   a memory cell array including a plurality of strings, each string including at least one ground select transistor, a plurality of memory cells and at least one string select transistor sequentially stacked on a substrate in a direction perpendicular to the substrate;
   a word line driver configured to drive a selected word line and unselected word lines among a plurality of word lines connected with the plurality of memory cells of each string respectively and to supply voltages to the plurality of word lines; and
   a read/write circuit configured to apply bias voltages to a plurality of bit lines connected with the plurality of strings respectively,
   the read/write circuit being configured to adjust levels of the bias voltages applied to the plurality of bit lines according to a location of the selected word line among the plurality of word lines.

2. The nonvolatile memory device of claim 1, wherein
   the plurality of word lines are stacked on the substrate in the direction perpendicular to the substrate, and
   the read/write circuit is configured to adjust the levels of the bias voltages applied to the plurality of bit lines according to a distance between the selected word line and the substrate.

3. The nonvolatile memory device of claim 1, wherein the read/write circuit is configured to sequentially decrease the levels of the bias voltages applied to the plurality of bit lines during a program operation according to an increase in a distance between the selected word line and the substrate.

4. The nonvolatile memory device of claim 1, wherein the read/write circuit is configured to sequentially decrease, increase, and decrease the levels of the bias voltages applied to the plurality of bit lines during a program operation according to an increase in a distance between the selected word line and the substrate.

5. The nonvolatile memory device of claim 1, wherein the read/write circuit is configured to sequentially increase and decrease the levels of the bias voltages applied to the plurality of bit lines during a program operation according to an increase in a distance between the selected word line and the substrate.

6. The nonvolatile memory device of claim 1, wherein the read/write circuit is configured to sequentially increase the levels of the bias voltages applied to the plurality of bit lines during a program verification operation according to an increase in a distance between the selected word line and the substrate.

7. The nonvolatile memory device of claim 1, wherein the read/write circuit is configured to sequentially increase, decrease, and increase the levels of the bias voltages applied to the plurality of bit lines during a program verification operation according to an increase in a distance between the selected word line and the substrate.

8. The nonvolatile memory device of claim 1, wherein the read/write circuit is configured to sequentially decrease and increase the levels of the bias voltages applied to the plurality of bit lines during a program verification operation according to an increase in a distance between the selected word line and the substrate.

9. The nonvolatile memory device of claim 1, wherein the read/write circuit is configured to adjust applying times of the bias voltages according to an increase of the levels of the bias voltages.

10. An operating method of a nonvolatile memory device, comprising:
    adjusting levels of bias voltages according to a location of a selected word line among a plurality of word lines;
    applying the adjusted bias voltages to bit lines; and
    applying voltages to the selected word line and unselected word lines among the plurality of word lines,
    wherein the nonvolatile memory device includes a plurality of strings, each string including at least one ground select transistor, a plurality of memory cells and at least one string select transistor sequentially stacked on a substrate in a direction perpendicular to the substrate,
    wherein the plurality of word lines are connected to the plurality of memory cells of each string,
    wherein the bit lines are connected to the plurality of strings respectively.

11. The operating method of claim 10, wherein
    the adjusting levels of bias voltages includes adjusting the levels of the bias voltages according to a distance between the selected word line and the substrate.

12. The operating method of claim 10, wherein the applying voltages to the selected word line and the unselected word lines includes:
    applying a pass voltage to the selected word line; and
    applying a program voltage to the selected word line.

13. The operating method of claim 12, wherein the adjusting levels of bias voltages includes sequentially decreasing the levels of the bias voltages according to an increase in a distance between the selected word line and the substrate.

14. The operating method of claim 10, wherein the applying voltages to the selected word line and unselected word lines includes:
    applying a read voltage to the unselected word lines; and
    applying a verification voltage to the selected word line.

15. The operating method of claim 14, wherein
    the adjusting levels of bias voltages includes sequentially increasing the levels of the bias voltages according to an increase in a distance between the selected word line and the substrate.

16. A nonvolatile memory device, comprising:
    a plurality of nand strings arranged in a first direction and a second direction on a substrate,
    each nand string including at least one ground select transistor, a plurality of memory cells and at least one string select transistor sequentially stacked on the substrate in a direction perpendicular to the substrate;
    a plurality of bit lines extending in the first direction,
    each bit line connected to at least two nand strings in the first direction,
    a plurality of word lines extending in the second direction,
    each word line being connected to a respective one of the plurality of memory cells in each of at least two nand strings in the second direction; and
    a control circuit configured to drive the plurality of word lines, respectively, and to adjust levels of bias voltages applied to the plurality of bit lines according to a location of a selected word line among the plurality of word lines.

17. The nonvolatile memory device of claim 16, wherein the control circuit is configured to
    sequentially decrease the levels of the bias voltages applied to the plurality of bit lines during a program operation according to an increase in a distance between the selected word line and the substrate, and
    sequentially increase the levels of the bias voltages applied to the plurality of bit lines during a program verification operation according to an increase in the distance between the selected word line and the substrate.

18. The nonvolatile memory device of claim 16, wherein each nand string includes,
    a pillar structure extending vertically from the substrate and including 1 to N parts, and 1 to N memory cells, where J to N memory cells of the 1 to N memory cells are on 1 to J memory cells of the 1 to N memory cells,
    the 1 to N memory cells defined by an insulating pattern connected to the 1 to N parts of the pillar structure and 1 to N of the plurality of word lines respectively,
    the 1 to N memory cells defined by an insulating pattern between the 1 to N parts of the pillar structure and 1 to N gate electrodes respectively,
    N being an integer greater than 5,
    J being an integer between 1 to N,
    the control circuit is configured to sequentially decrease the levels of the bias voltages applied to the plurality of bit lines during a program operation according to an increase in a distance between the selected word line and the substrate, when the selected word line is connected to one of the 1 to J memory cells of at least one nand string, and
    the control circuit is configured to sequentially decrease the levels of the bias voltages applied to the plurality of bit lines during a program operation according to an increase in a distance between the selected word line and the substrate, when the selected word line is connected to one of the J+1 to N memory cells of at least one nand string.

19. The nonvolatile memory device of claim 16, wherein each nand string includes,
    a pillar structure extending vertically from the substrate and including 1 to N parts, and
    1 to N memory cells, where J to N memory cells of the 1 to N memory cells are on 1 to J memory cells of the 1 to N memory cells,
    the 1 to N memory cells defined by an insulating pattern connected to the 1 to N parts of the pillar structure and 1 to N of the plurality of word lines respectively,
    N being an integer greater than 5,
    J being an integer between 1 to N,
    the control circuit is configured to sequentially increase the levels of the bias voltages applied to the plurality of bit lines during a program verification operation according to an increase in a distance between the selected word line and the substrate, when the selected word line is connected to one of the 1 to J memory cells of at least one nand string, and the control circuit is configured to sequentially increase the levels of the bias voltages applied to the plurality of bit lines during a program verification operation according to an increase in a distance between the selected word line and the substrate, when the selected word line is connected to one of the J+1 to N memory cells of at least one nand string.

20. The nonvolatile memory device of claim 16, wherein each nand string includes, a pillar structure extending vertically from the substrate and including 1 to N parts, and 1 to N memory cells, where J to N memory cells of the 1 to N memory cells are horizontally spaced apart from 1 to J memory cells of the 1 to N memory cells, the 1 to N memory cells defined by an insulating pattern connected to the 1 to N parts of the pillar structure and 1 to N of the plurality of word lines respectively, N being an integer greater than 5, J being an integer between 1 to N.

* * * * *